United States Patent
Lunsman et al.

(10) Patent No.: US 12,038,618 B2
(45) Date of Patent: Jul. 16, 2024

(54) CORRUGATED THERMAL INTERFACE DEVICE WITH LATERAL SPRING FINGERS

(71) Applicant: HEWLETT PACKARD ENTERPRISE DEVELOPMENT LP, Houston, TX (US)

(72) Inventors: Harvey John Lunsman, Chippewa Falls, WI (US); Steven Dean, Chippewa Falls, WI (US)

(73) Assignee: Hewlett Packard Enterprise Development LP, Spring, TX (US)

(*) Notice: Subject to any disclaimer, the term of this patent is extended or adjusted under 35 U.S.C. 154(b) by 64 days.

(21) Appl. No.: 17/867,862

(22) Filed: Jul. 19, 2022

(65) Prior Publication Data
US 2024/0027708 A1  Jan. 25, 2024

(51) Int. Cl.
*G02B 6/42* (2006.01)
*H05K 7/20* (2006.01)

(52) U.S. Cl.
CPC ....... *G02B 6/4269* (2013.01); *H05K 7/20254* (2013.01); *H05K 7/2049* (2013.01); *H05K 7/20409* (2013.01)

(58) Field of Classification Search
CPC ........... H05K 7/20254; H05K 7/20409; H05K 7/20418; H05K 7/20454; H05K 7/2049; H01R 13/6581; H01R 24/28; H01R 24/64; H01R 25/006; H01R 2107/00
See application file for complete search history.

(56) References Cited

U.S. PATENT DOCUMENTS

| | | | |
|---|---|---|---|
| 4,800,956 A * | 1/1989 | Hamburgen | H01L 23/4338 257/713 |
| 5,052,481 A * | 10/1991 | Horvath | H01L 23/4338 165/185 |
| 6,176,304 B1 * | 1/2001 | Lee | F28F 3/06 257/722 |
| 6,583,986 B1 | 6/2003 | Storti et al. | |
| 8,659,147 B2 * | 2/2014 | Mitsui | H01L 23/49568 257/713 |
| 9,668,379 B1 * | 5/2017 | Bucher | H05K 7/20436 |
| 9,912,107 B2 * | 3/2018 | Bucher | G02B 6/4269 |
| 9,924,615 B2 * | 3/2018 | Bucher | G02B 6/4277 |
| 10,249,983 B2 | 4/2019 | Regnier et al. | |
| 10,398,050 B2 | 8/2019 | Tracy et al. | |
| 10,667,431 B1 * | 5/2020 | Lunsman | H05K 7/20254 |
| 2013/0235529 A1 | 9/2013 | Yang et al. | |

* cited by examiner

*Primary Examiner* — Zachary Pape
(74) *Attorney, Agent, or Firm* — Jones Robb PLLC

(57) ABSTRACT

A first electronic device may comprise a chassis and first fins. The chassis may be configured to removably couple with a second electronic device. The first fins are configured to interleave with second fins of the second electronic device in a coupled state of the first and second electronic devices. A corrugated thermal interface device comprises folded fins. The folded fins are coupled to the first fins and are also removably couplable to the second fins in the coupled state of the first and second electronic devices. Each folded fin comprises one or more lateral walls, and the corrugated thermal interface device further comprises a plurality of spring fingers coupled to and extending at least partially in a lateral direction from the lateral walls. The spring finger contacts may be contacted and displaced by the second fins in the coupled state of the first and second electronic devices.

19 Claims, 17 Drawing Sheets

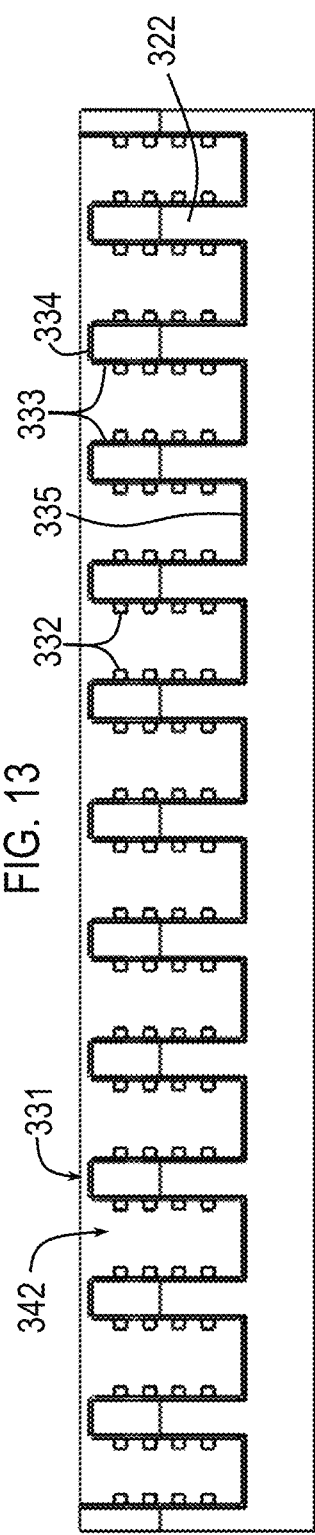
FIG. 13
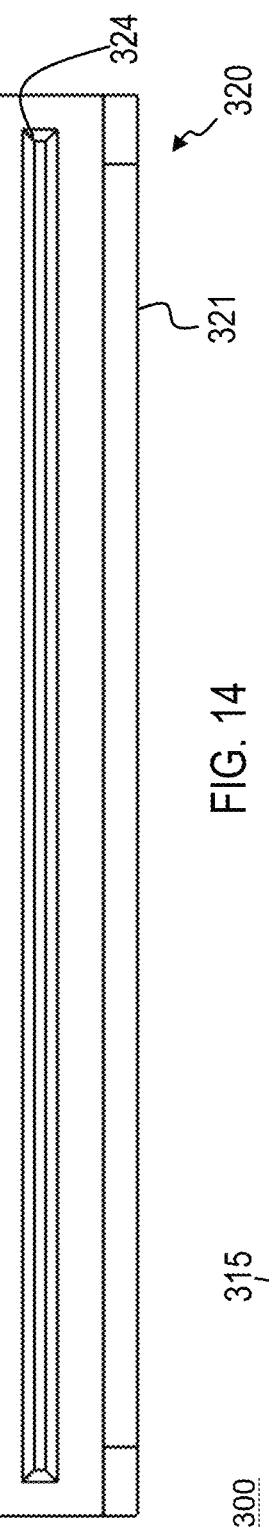
FIG. 14
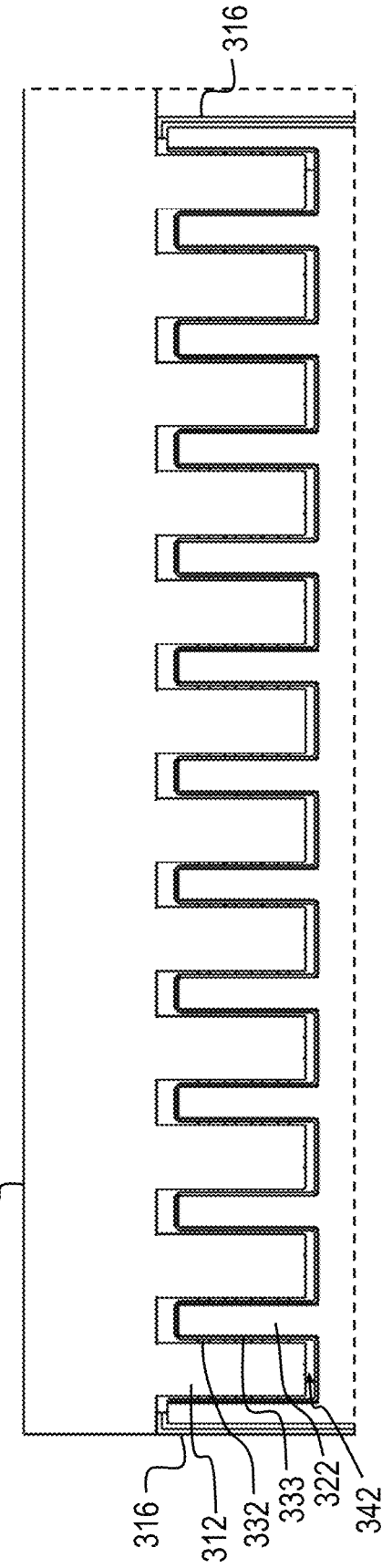

CORRUGATED THERMAL INTERFACE DEVICE WITH LATERAL SPRING FINGERS

INTRODUCTION

Electronic devices, such as computers, networking devices, power supply units, etc., may be configured to removably mate with various pluggable auxiliary devices, which are sometimes called pluggable modules. The electronic device has a receptacle configured to removably receive the pluggable auxiliary device, with the receptacle comprising one or more connectors to mate with complementary connector(s) of the pluggable auxiliary device to establish an electronic, optical, or other connection through which signals can be communicated. Non-limiting examples of pluggable auxiliary devices include pluggable optical transceivers (e.g., Quad Small Form-Factor Pluggable (QSFP) connectors, Octal Small Form-Factor Pluggable (OSFP) connectors, etc.), PCIe cards, Solid State Drives (SSD) such as NVMe or M.2 SSDs, hard disk drives, power supplies, and other similar devices.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings:

FIG. 13 is a front view of the pluggable auxiliary device and the corrugated thermal interface device of FIG. 4 in the assembled state from the perspective indicated by arrow 13.

FIG. 14 is a view of the system of FIG. 6 in the plugged-in state of the pluggable auxiliary device from the perspective indicated by the arrow 14, with a rear portion of the pluggable auxiliary device being omitted to allow fins 322 to be visible.

DETAILED DESCRIPTION

Figure 1:
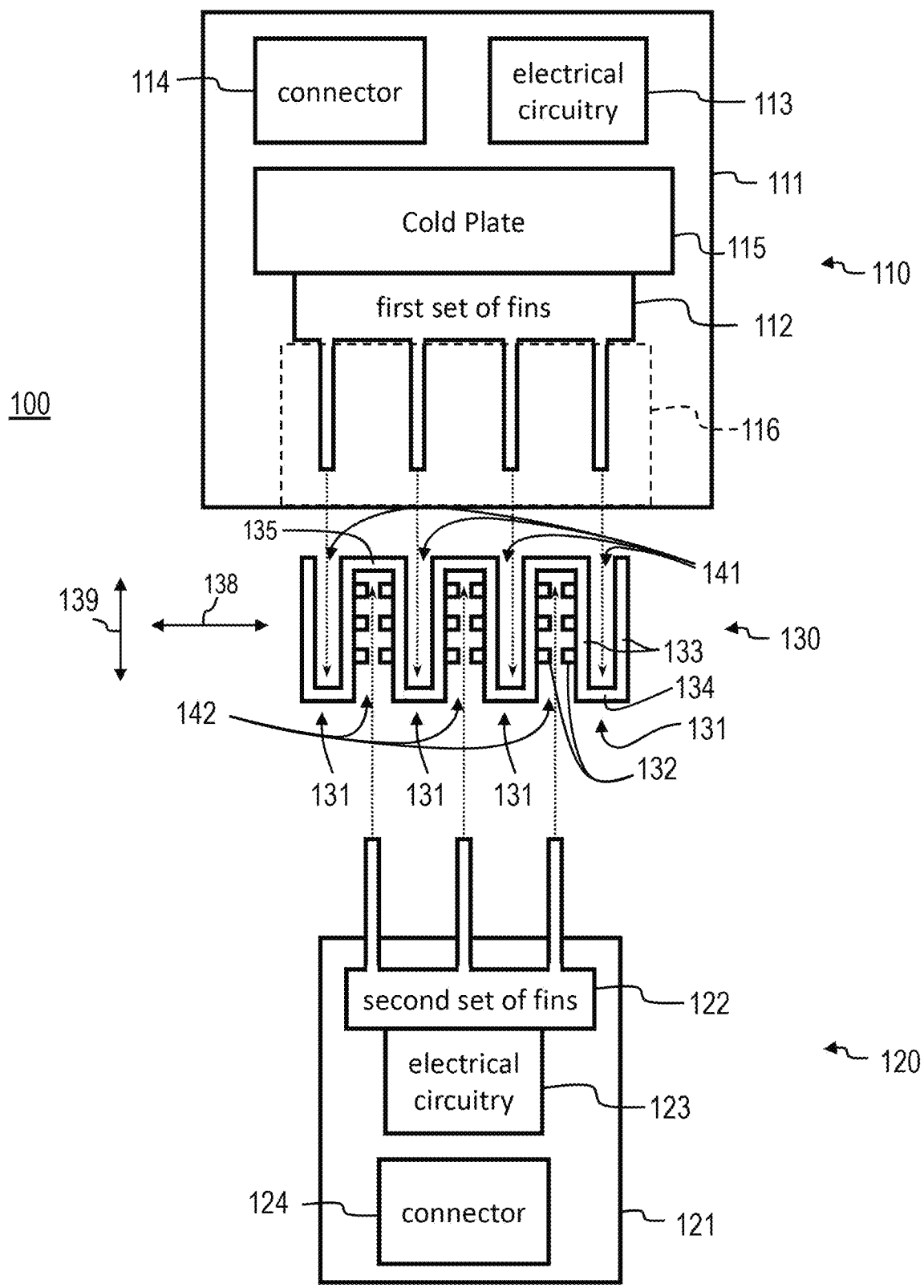
FIG. 1 is a block diagram illustrating an example of system.

As noted above, in some systems an electronic device is configured to removably receive a pluggable auxiliary device. The electronic device configured to receive the pluggable auxiliary device may be referred to herein as a "primary electronic device" to distinguish it from the pluggable auxiliary device. However, it should be understood that "primary" is used in this context merely as a label and this terminology is not intended to otherwise limit the configuration or usage of the electronic device. The pluggable auxiliary device may also be referred to as a "pluggable device," "auxiliary device," or "pluggable module."

Some pluggable auxiliary devices generate substantial amounts of heat when in use. For example, some pluggable optical transceivers can generate on the order of 80 Watts per device. Moreover, the amount of heat generated by various pluggable auxiliary devices is expected to increase with successive generations of the devices as they become faster, denser, add more functionality, and/or otherwise improve. Thus, some systems include cooing solutions to remove heat from the pluggable auxiliary devices to keep their temperature in a desired range. For example, some systems are configured to cool the pluggable auxiliary devices by generating an airflow (e.g., via a fan of the system) and directing the airflow over/around the pluggable auxiliary devices (e.g., via openings in the receptacle that receives the pluggable auxiliary device) to remove heat therefrom. However, in some circumstances air cooling may not be a viable solution for cooling the pluggable auxiliary devices. For example, in some systems, such as in a 100% liquid-cooled computing system for example, there may not be any fans within the system and thus there may be no or limited air movement over the pluggable auxiliary devices in such systems. As another example, in some systems airflow may be present but may be insufficient to cool the pluggable auxiliary devices to the desired level. This may occur in some cases because of airflow restrictions around the pluggable auxiliary devices prevent adequate airflow from reaching the pluggable auxiliary devices. In other cases, the pluggable auxiliary device may generate so much heat that, even with adequate airflow air cooling may not be sufficient to cool the pluggable devices.

Thus, to provide reliable and robust cooling capabilities for pluggable auxiliary devices, systems disclosed herein may utilize liquid to cool the pluggable auxiliary devices. In particular, systems disclosed herein are provided with a liquid cooling loop that circulates a flow of liquid coolant (e.g., water or other coolant) through the primary electronic device to remove heat from various heat sources therein (liquid cooling loops such as these are familiar to those of ordinary skill in the art). However, because the pluggable auxiliary devices are intended to be repeatedly plugged into and unplugged from the system, it can be challenging to integrate the pluggable auxiliary devices into the liquid cooling loop. For example, pluggable auxiliary devices cannot be directly and permanently coupled to the liquid cooling loop in the same way that other devices, such as CPUs, can be, as such permanent coupling would interfere with the ability to plug and unplug the pluggable auxiliary devices. Thus, in systems and devices disclosed herein a cold plate may be used make contact with the pluggable auxiliary devices when they are plugged into the system in a manner that does not interfere with relatively easy plugging and unplugging of the pluggable auxiliary device. This physical contact between the pluggable auxiliary devices and the cold plate creates a conductive thermal interface whereby heat may be conductively transferred from the pluggable auxiliary devices into the cold plate, and then from the cold plate into a flow of liquid coolant thermally coupled to the cold plate. This liquid cooling approach may be particularly useful in systems in which fans are not present or in which air cooling would otherwise be insufficient to cool the pluggable auxiliary devices.

In some circumstances, it can be difficult to obtain heat transfer rates that are large enough to achieve desired temperatures if the interface between the pluggable auxiliary devices and the cold plate comprises only direct physical contact between the two devices. For example, if the respective contact surfaces of the cold plate and the auxiliary device are not sufficiently flat and parallel, surface imperfections and/or the divergent orientations of the surfaces may result in air gaps between the two contact surfaces, thus reducing the total contact area between the cold plate and the auxiliary device and consequently the heat transfer rate. In other contexts, a thermal interface material (TIM), such as a thermal grease, thermal paste, or a thermal contact pad, has successfully been used as an interface between two contacting surfaces to fill the air gaps therebetween and thus to allow for improved heat transfer rates therebetween. However, such TIMs may not be well suited for use with pluggable auxiliary devices because plugging and unplugging of the devices from the system may strip away or damage the TIM, and thus the TIM may need to be reapplied periodically (e.g., each time the auxiliary device is plugged in, in some cases). Moreover, thermal greases and pastes may be messy and difficult to use, and thermal contact pads may not provide sufficient heat transfer rates in some applications.

An alternative way to reduce such air gaps without the use of a TIM is to have relatively strict tolerances and tightly fitting parts, including strict tolerances for the contacting surfaces to ensure minimal imperfections and also strict tolerances for components that guide the two contacting surfaces into contact with one another so as to ensure flush contact is achieved between the contact surfaces. But such strict tolerances can make manufacture of the devices very difficult and costly. Moreover, in the context of pluggable auxiliary devices, ensuring flush contact of the contacting surfaces may require a relatively tight fit between the pluggable auxiliary device and the receptacle that receives it, which can make it more difficult to plug and unplug the auxiliary devices.

Accordingly, to address the challenges associated with achieving sufficient heat transfer rates between the pluggable auxiliary device and the cold plate while avoiding some of the drawbacks of traditional TIMs and of requiring strict tolerances, examples disclosed herein provide a thermal interface device between the cold plate and the pluggable auxiliary device that allows for a high rate of heat transfer while also allowing all of the components to be relatively easy to manufacture and use in a pluggable context. In particular, examples disclosed herein may utilize a corrugated thermal interface device positioned between the cold plate and the pluggable auxiliary device, with the corrugated thermal interface device comprising a plurality of folded fins (e.g., formed from folded sheet metal) and spring fingers coupled to the folded fins. The spring fingers are arranged to extend between the cold plate and the pluggable auxiliary device to form a conductive pathway therebetween. The spring fingers extend across air gaps that may exist between the cold plate and the pluggable auxiliary device, and because the spring fingers are elastically deformable, they can flex to accommodate variations in the gap distances that may occur due to surface imperfections and/or misalignment of the cold plate and/or auxiliary device. Thus, the spring fingers are able to maintain reliable contact with the cold plate or auxiliary device, and hence allow for high heat transfer rates between the pluggable auxiliary device and the cold plate, thereby permitting less strict manufacturing tolerances or as tight of a fit between the pluggable auxiliary device and receptacle. For example, in some implementations the corrugated thermal interface device may be capable of transferring heat between the pluggable auxiliary device and the cold plate at a rate of at least 0.005 W per spring finger contact per 1° C. temperature differential between liquid coolant and pluggable auxiliary device (i.e., the total heat transfer rate equals the total number of spring finger contacts multiplied by 0.005 and multiplied by the temperature differential between the liquid coolant and the pluggable auxiliary device). In other words, each spring finger contact may have a thermal resistance of around 200° C./W or less. Thus, for example, a corrugated thermal interface device with 400 spring finger contacts operating at a 20° C. temperature differential would transfer 40 W of heat. Moreover, the spring fingers may allow for relatively low insertion and removal forces to plug or unplug the pluggable device, such as around 5 lbf (22.2 N) or less in some implementations or 25 lbf (111.2 N) or less in other implementations. In addition, the spring fingers may be made of a relatively resilient material (e.g., a copper alloy) and may be able to survive many insertion/removal cycles without needing replacement (in contrast to thermal gap pads, for example, which may fail after a few insertion/removal cycles, or thermal greases or pastes which may require frequent reapplication).

In various examples disclosed herein, both the pluggable auxiliary device and the primary electronic device are provided with sets of fins (e.g., extruded fins). The fins of the auxiliary device are thermally coupled to a heat source (e.g., electronic circuitry) in the auxiliary device. The fins of the primary electronic device are thermally coupled to the cold plate. The fins of the primary and auxiliary devices are arranged to interleave with one another when the auxiliary device is plugged into the receptacle of the primary electronic device, with the corrugated thermal interface device being positioned between and engaged with both sets of fins. In particular, prior to the auxiliary device being plugged into the primary electronic device, a first side of the corrugated thermal interface device is affixed to a first set of fins (the first set of fins may be the fins of the auxiliary device in some examples, or the fins of the primary device in other examples), with the first set of fins being received within a first set of grooves defined by the folded fins on the first side of the corrugated thermal interface device. Then as the pluggable auxiliary device is plugged into the primary electronic device, a second side of the corrugated thermal interface device becomes removably engaged with a second set of fins (the second set of fins may be the fins of the primary device in some examples or the fins of the auxiliary device in other examples), with the second set of fins being received within a second set of grooves defined by the folded fins on the second side of the corrugated thermal interface device. The spring fingers extend laterally from lateral walls of the folded fins into the second set of grooves, and thus as the second set of fins is received within the second set of grooves, the second set of fins comes into contact with and elastically deforms the spring fingers. Thus, the first side of the corrugated thermal interface device is thermally coupled to either the auxiliary device or the cold plate as a result of being affixed to the fins thereof and the second side of the corrugated thermal interface device is thermally coupled to the other one of the cold plate or the auxiliary device as a result of the spring fingers being in contact with the fins thereof, and therefore the corrugated thermal interface device forms a thermally conductive pathway between the auxiliary device and the cold plate.

Moreover, because the folded fins of the corrugated thermal interface device are folded, the corrugated thermal interface device has greater surface area than that of a flat surface of similar footprint. More specifically, even if only the lateral walls of the folded fins are considered (as this is where the spring fingers are disposed), the aggregate surface area of these lateral walls on one side of the corrugated thermal interface device can be much greater than the surface area of a flat surface having a similar footprint. Because the corrugated thermal interface device has more surface area upon which spring fingers can be arranged, more spring fingers can be provided on the corrugated thermal interface device than could be provided on the flat surface with similar footprint (assuming the same spring finger size and spacing for both). The specific number of spring fingers gained by using a corrugated thermal interface device as compared to a flat surface may vary from one system to the next depending on various parameters (such as the number of folded fins, the dimensions of the folded fins, etc.), but in many configurations the gain in number of spring fingers can be substantial. For example, in one corrugated thermal interface device having a footprint of around 8.0 in$^2$ (51.6 cm$^2$), the total surface area of the lateral walls of the corrugated thermal interface device on one side thereof may be around 21 in$^2$ (135.5 cm$^2$), allowing for more than twice the number of spring fingers to be arranged on the lateral walls of the corrugated thermal interface device than could be arranged on a flat surface having the same footprint. The increase in the number of spring fingers on the corrugated thermal transfer device allows for a greater total contact area of the spring fingers with the cold plate or auxiliary device, and hence a greater heat transfer rate therebetween.

In addition, use of the corrugated thermal interface device may allow for certain pluggable auxiliary devices that are useable in an air-cooled system to also be relatively easily converted for use in a liquid cooled system. For example, it may be possible for certain industry standard or "off the shelf" pluggable auxiliary devices that are designed primarily (or exclusively) with air-cooling in mind to nevertheless be liquid cooled without extensive redesign or modification (including, for example, in certain 100% liquid cooled systems with no forced airflow). For example, a pluggable auxiliary device designed for use in an air-cooled system may have a heat sink comprising a set of fins which are arranged to receive air flowing over/through/around the fins and to exchange heat with the airflow. To enable liquid cooling of such a pluggable auxiliary device according to aspects disclosed herein, a corrugated thermal interface device and fins of a cold plate of the liquid cooled system may be dimensioned so as to be capable of engaging the fins of the heat sink, the corrugated thermal interface device may be attached to either the pluggable auxiliary device or to the fins of the cold plate, and then the fins of the heat sink may be engaged with the fins of the cold plate with the corrugated thermal interface device disposed therebetween in the manner described above. Thus, conversion of the pluggable auxiliary device to allow for liquid cooling may require either minimal modification of the pluggable auxiliary device (i.e., affixing the corrugated thermal interface device to the fins of the heatsink) or potentially no modification of the pluggable auxiliary device in examples where the corrugated thermal interface device is affixed to the cold plate. This ability of the liquid cooled system to utilize the same pluggable auxiliary devices that an air-cooled system can utilize may greatly reduce costs and allow for greater flexibility.

Turning now to the figures, various devices, systems, and methods of the present disclosure will be described.

FIG. 1 is a block diagram conceptually illustrating a system 100. It should be understood that FIG. 1 is not intended to illustrate specific shapes, dimensions, or other structural details accurately or to scale, and that implementations of the system 100 may have different numbers and arrangements of the illustrated components and may also include other parts that are not illustrated.

As shown in FIG. 1, the system 100 comprises a first electronic device 110, a second electronic device 120, and a corrugated thermal interface device 130. The second electronic device 120 is a pluggable auxiliary device configured to be removably plugged into the first electronic device 110, with the corrugated thermal interface device 130 forming a thermal interface between the two.

The first electronic device 110 comprises a chassis 111, a first set of fins 112, electronic circuitry 113, a connector 114, and a cold plate 115. The first electronic device 110 may be any type of electronic device that can receive a pluggable auxiliary device, including for example a computing system (e.g., a server, a high performance computing system (HPC), a converged system, a hyperconverged system, a blade server system, a composable infrastructure system, etc.), a networking device (e.g., a switch, a router, etc.), a power supply unit or power distribution unit, or other similar electronic device. The electronic circuitry 113 may include any type of electronic circuitry, such as, for example, processing circuitry, memory devices, electrical power conversion circuitry, optical transceiver circuitry (which may comprise, for example, light sources (e.g., lasers), light sensors (e.g., photodiodes), etc.), etc. The connector 114 comprises an electrical connector, optical connector, or other connector for mating with a complementary connector (e.g., the connector 124) to establish a signaling/communication path to another device (e.g., the second electronic device 120). The connectors 114 and 124 mating may involve physical engagement and/or being placed in sufficient proximity and alignment to exchange signals. The chassis 111 comprises a structure that supports and/or houses the other parts of the device 110. The chassis 111 also comprises a receptacle 116 configured to removably receive at least a portion of the second electronic device 120 therein to removably couple the first and second electronic devices 110 and 120 together. The first set of fins 112 are coupled to and extend from a common base, which is part of or thermally coupled to the cold plate 115, with the fins 112 arranged to transfer heat into the cold plate 115. The first set of fins 112 extends at least partially into the receptacle 116 so that they can interleave with the second set of fins 122 of the second electronic device 120 when the second electronic device 120 is plugged into the receptacle 116. The first set of fins 112 may be formed from a thermally conductive material, such as copper (or an alloy thereof), aluminum (or an alloy thereof), steel, a thermally conductive plastic, etc. For example, the fins 112 may be formed by extrusion, machining (e.g., skiving), molding, casting, or additive manufacturing (e.g., 3D printing).

The second electronic device 120 comprises a chassis 121, a second set of fins 122, electronic circuitry 123, and a connector 124. The second electronic device 120 may be any type of pluggable auxiliary device, including for example a pluggable optical connector/transceiver (e.g., a QSFP connector, an OSFP connector, etc.), a PCIe card, an SSD (e.g., an NVMe SSD, M.2 SSD, etc.), a hard disk drive, a power supply, or other similar device. The electronic circuitry 123 may include any type of electronic circuitry, such as, for example, optical transceiver circuitry, processing circuitry, memory devices, etc. The connector 124 comprises an electronic connector, optical connector, or other connector for mating with the connector 114 to establish a signaling/communication path to the first electronic device 110. The chassis 121 comprises a structure that supports and/or houses the other parts of the device 120. The second set of fins 112 are coupled to and extend from a common base, which is thermally coupled to the electronic circuitry 123, such that the fins 112 remove heat from the electronic circuitry 123. In some examples, the fins 112 may be configured as a heat sink for air cooling the pluggable auxiliary device 120 when used in an air-cooled system. The second set of fins 122 is at least partially exposed to an exterior of the device 120 so that they can interleave with the first set of fins 112 when the second electronic device 120 is plugged into the receptacle 116. The second set of fins 122 may be formed in a similar manner as the first set of fins 112.

As noted above, the second electronic device 120 is configured to be plugged into the receptacle 116 of the first electronic device 110. When the second electronic device 120 is plugged in, the connectors 114 and 124 are coupled together and this communicably connects the first electronic device 110 and second electronic device 120 such that signals (e.g., electronic signals, optical signals, etc.) can be communicated between the two. Moreover, when the second electronic device 120 is plugged into the receptacle 116, the first and second sets of fins 112 and 122 interleave, with the corrugated thermal interface device 130 (described further below) being disposed between and engaged with both sets of fins 112 and 122.

The corrugated thermal interface device 130 comprises a plurality of folded fins 131 which are coupled together to form a corrugated shape. Each folded fin 131 comprises a pair of lateral walls 133 and an end portion 134. The lateral walls 133 face generally in a lateral direction, meaning the faces of the lateral walls 133 are approximately perpendicular to the lateral direction. Thus, the faces of the lateral walls 133 extend generally in (i.e., are approximately parallel to) the height dimension 139 of the folded fins 131 (see FIG. 1) and extend generally in (i.e., are approximately parallel to) a longitudinal dimension of the folded fins 131 (perpendicular to the page in FIG. 1). The lateral walls 133 can be angled somewhat relative to the height dimension 139 and thus are not necessarily perfectly parallel thereto. In some examples, the lateral walls 133 are within +/−10 degrees of parallel to the height dimension 139. The lateral walls 133 are spaced apart from one another along the lateral dimension 138. The pair of lateral walls 133 of a given folded fin 131 are coupled together by the first end portion 134 of the folded fin 131, with the first end portion 134 being located at one end of the folded fin 131. A pair of adjacent folded fins 131 are coupled together by a second end portion 135 located at respective ends of the two folded fins 131 opposite from their respective first end portions 134, as shown in FIG. 1. The end portions 134 and 135 extend at least in part along the lateral dimension 138 between adjacent lateral walls 133 and also extend along the longitudinal dimension. Although shown schematically in FIG. 1 as being flat, the end portions 134 may be curved, flat, angled, pointed, or combinations thereof. In some examples, the end portions 134 and 135 are integrally coupled to the lateral walls 133 and comprise one or more bent, curved, and/or folded sections forming a transition between the lateral wall 133 and the end portion 134 or 135.

The folded fins 131 define a first set of grooves 141 on a first side of the corrugated thermal interface device 130 and define a second set of grooves 142 on a second side of the corrugated thermal interface device 130. Each groove of the first set of grooves 141 is defined by the lateral walls 133 and the first end portion 134 of one of the folded fins 131, whereas each groove of the second set of grooves 142 is defined by two lateral walls 133 of a pair of adjacent folded fins 131 and the second end portion 135 coupling those two folded fins 131 together. The first and second sets of grooves 141 and 142 all extend along the longitudinal dimension of the folded fins 131. Moreover, the corrugated thermal interface device 130 comprises a plurality of spring fingers 132 (only some are labeled in FIG. 1) coupled to and extending at least in part in a lateral direction from lateral walls 133 (only some are labeled in FIG. 1) of the folded fins 131. The spring fingers 132 may also extend at least in part in longitudinal direction such that the spring fingers 132 are angled relative to the lateral walls 133.

The corrugated thermal interface device 130 may be formed from one or more thermally conductive materials, including in some cases a highly thermal conductive material. Moreover, the material of at least the spring fingers 132, in addition to being thermally conductive (in some cases highly thermally conductive), may be relatively resilient and robust so as to allow the spring fingers 132 to act as springs (i.e., when displaced in a lateral direction by contact with the fins 122 the spring fingers 132 elastically deform) and to withstand repeated plugging and unplugging of the second electronic device 120. For example, in some examples the corrugated thermal interface device 130 (including the spring fingers 132) is made from a metal, such as copper, a copper alloy (such as a copper-beryllium alloy, a copper-zirconium alloy, etc.), an aluminum alloy, or other similar materials.

The corrugated thermal interface device 130 can be formed from a single piece of sheet metal that has been formed (e.g., folded) to obtain a corrugated shape with a plurality of folded fins 131. Alternatively, the corrugated thermal interface device 130 can be formed from separate pieces that are joined together (e.g., by welding, soldering, mechanical fastening techniques, etc.); for example, discrete sections comprising one folded fin 131 or a subset of integrally coupled folded fins 131 may be formed separately and then joined together to form the corrugated shape. The corrugated thermal interface device 130 can be formed by a variety of techniques, including, but not limited to, machining one or more pieces of material, for example by cutting the grooves 141 and 142 into a solid block of material, extrusion, and/or additive manufacturing techniques, such as 3D printing.

The spring fingers 132 may be formed prior to forming the folded fins 131 (e.g., prior to bending a piece of sheet metal into the corrugated shape) or after or simultaneously with the formation of the corrugated shape. In some examples the spring fingers 132 are integral to (part of the same unitary body as) the lateral walls 133. For example, a spring finger 132 may be formed by cutting out a portion of a lateral wall 133 (or a portion of material that will ultimately become the lateral wall 133 in cases in which the spring finger 132 is being formed prior to forming the corrugated shape) while leaving one end thereof integrally coupled to the remainder of the lateral wall 133, and then bending the partially separated portion in a lateral direction. Although the aforementioned cutting and bending are described as and can be separate operations, in some examples the cutting and bending that forms the spring fingers 132 may occur as part of the same operation (e.g., stamping the lateral wall 133 to simultaneously cut out and bend the spring finger 132). As another example, the spring fingers 132 may be formed simultaneously with the lateral wall 133 during a molding, casting, die casting, or additive manufacturing process. In still other examples the spring fingers 132 are formed separately from and are later coupled to the lateral walls 133, for example via welding, soldering, adhesive, etc. Moreover, although in some examples the spring fingers 132 and lateral walls 133 are formed from the same type of material, in some examples the spring fingers 132 and the lateral walls 133 could be different types of materials.

As noted above, the corrugated thermal interface device 130 is configured to engage with both sets of fins 112 and 122 when the second electronic device 120 is plugged into the receptacle 116. More specifically, the corrugated thermal interface device 130 is affixed to one of the sets of fins 112 or 122 and is removably engageable with the other set of fins 122 or 112 when the second electronic device 120 is plugged into the receptacle 116. In particular, one of the sets of fins 112 or 122 is received within the first set of grooves 141, and this set of fins 112 or 122 is affixed to the corrugated thermal interface device 130, for example by mechanical fasteners, welding, solder, adhesives, a friction fitting, and/or other connection mechanisms. In this affixed state, the set of fins 112 or 122 is thermally coupled with at least some of the lateral walls 133 of the corrugated thermal interface device 130 (e.g., they are in direct physical contact with one another or in mutual contact with a thermally conductive intermediary, such as solder, a TIM, etc.). In addition, the corrugated thermal interface device 130 is configured to removably engage with the other set of fins 122 or 112 by receiving the other set of fins 122 and 112 in the second set of grooves 142 in response to the second electronic device 120 being plugged into the receptacle 116 (the corrugated thermal interface device 130 becomes disengaged with the other set of fins 122 or 112 when the second electronic device 120 is unplugged from the receptacle 116). As this other set of fins 122 or 112 is being received in the second set of grooves 142, the fins 112 or 122 come into contact with and displace the spring fingers 132 that extend into the grooves 142. The spring fingers 132 are displayed in a lateral direction back toward the lateral walls 133 to which they are coupled. The displacement of the spring fingers 132 causes elastic deformation thereof, resulting in a restoring spring force which urges the spring fingers in a lateral direction opposite that of the displacement, consequently pressing the spring fingers 132 against the lateral surfaces of the fins 112 or 122, thus ensuring that contact is maintained by the spring fingers 132 with the fins 112 or 122. In some examples, in addition to extending laterally from the lateral walls 133, the spring fingers 132 are also angled so as to extend at least in part in a same direction that the fins 112 or 122 will be inserted into the second set of grooves 142.

In some examples, the first set of fins 112 is received within the first set of grooves 141 and affixed to the corrugated thermal interface device 130, and the second set of fins 122 is removably receivable within the second set of grooves 142 and engageable with the spring fingers 132, as illustrated by the dash-lined arrows in FIG. 1. In other words, in these examples the corrugated thermal interface device 130 remains attached to the first electronic device 110 (inside of the receptacle 116) and is removably engageable with the second electronic device 120. Note that the dash-lined arrows in FIG. 1 are to indicate locations of the fins 112 and 122 when engaged with the corrugated thermal interface device 130, but do not necessarily illustrate a direction of motion of the fins 112 or 122 during the engagement process—for example, the second set of fins 122 may be received into the second set of grooves 142 by moving parallel to the longitudinal dimension of the folded fins 131.

In other examples, the second set of fins 122 is received within the first set of grooves 141 and affixed to the corrugated thermal interface device 130, and the first set of fins 112 is removably receivable within the second set of grooves 142 and engageable with the spring finger 132. In other words, in these examples the corrugated thermal interface device 130 remains attached to the second electronic device 120 and is removably engageable with the first electronic device 110. In such examples, the orientation of the corrugated thermal interface device 130 may be reversed relative to that depicted in FIG. 1, such that the first set of grooves 141 face the second set of fins 122 and the second set of grooves 142 face the first set of fins 112.

Regardless of which arrangement described above is used, in a state of the second electronic device 120 plugged into the receptacle 116, the corrugated thermal interface device 130 is thermally coupled to both the first set of fins 112 and the second set of fins 122 (either because of being affixed thereto or via contact with the spring fingers 132), and thus the first and second sets of fins 112 and 122 and the corrugated thermal interface device 130 collectively form a thermally conductive pathway between the electronic circuitry 123 and the cold plate 115, allowing for heat generated by the electronic circuitry 123 to be efficiently removed into the cold plate 115 (and from there the heat can be transferred into the liquid coolant, for example). The system of FIG. 1 may allow for relatively high rates of heat transfer between the electronic circuitry 123 and the cold plate 115 without some of the drawbacks noted above in relation to other cooling approaches.

Moreover, the corrugated thermal interface device 130 allows for the omission of a TIM between the contact surfaces that move relative to and rub against one another during plugging and unplugging of the second electronic device 120, including for example the surfaces of the corrugated thermal interface device 130 facing into the second set of grooves 142 and the surfaces of whichever set of fins 112 or 122 are removably received within the second set of grooves 142. By not using TIM on surfaces that move and rub against one another during plugging/unplugging, the issues noted above related to the TIM being stripped off or damaged by such moving contact surfaces can be avoided. However, it should be understood that the issues noted above of TIMs being stripped off or damaged by the plugging/unplugging do not necessarily occur for contact surfaces that do not move relative to one another during plugging/unplugging, and therefore in various systems disclosed herein a TIM may be used between certain surfaces that do not move relative to one another during plugging/unplugging, such as between the second set of fins 122 and the electronic circuitry 123, between the first set of fins 112 and the cold plate 115 (if they are not part of the same body), or between the surfaces of the corrugated thermal interface device 130 facing into the first set of grooves 141 and the surfaces of whichever set of fins 112 or 122 are removably received within the first set of grooves 141. Moreover, in some cases, a TIM may even be applied between the moving surfaces, if desired, although this may result in some of the above-described drawbacks.

In FIG. 1 and the description above, various parts are described separately for ease of description, but it should be understood that such separately described parts could be part of the same unitary body. For example, the second set of fins could be integral to (part of the same unitary body as) the chassis 121 of the second electronic device 120. As another example, the first set of fins 112 could be integral to (part of the same unitary body as) the cold plate 115. As another example, the spring fingers 132 could be integral to (part of the same unitary body as) the lateral walls 133 of the corrugated thermal interface device 130.

Figure 2:
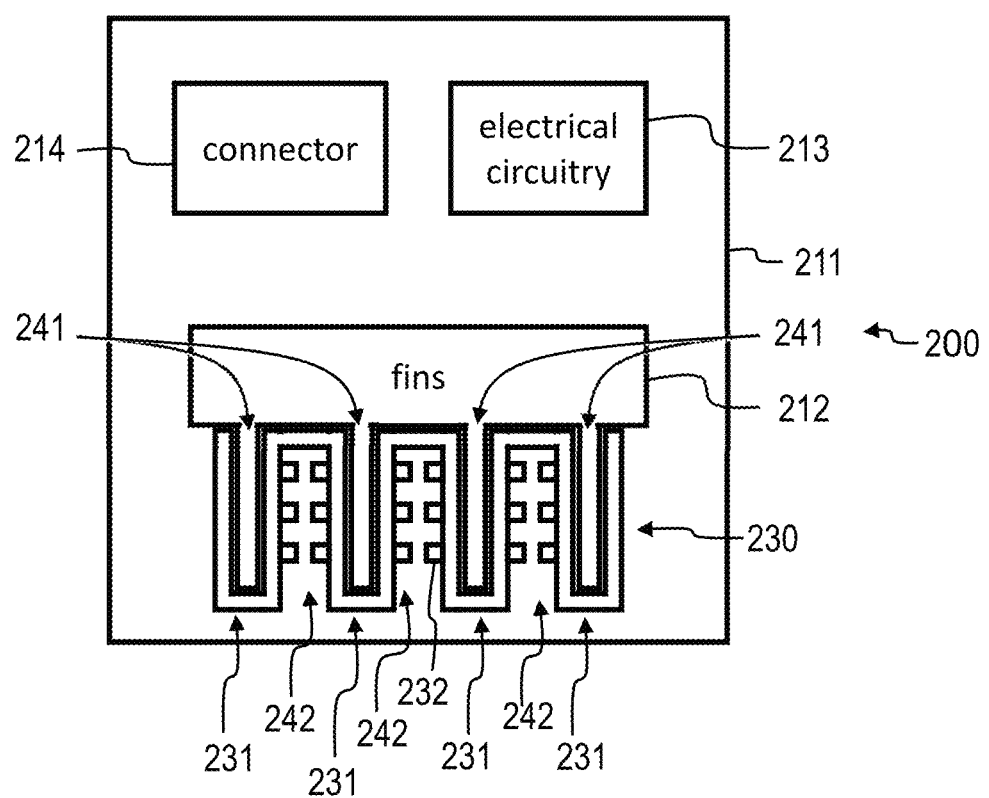
FIG. 2 is a block diagram illustrating an example of electronic device.

Turning now to FIG. 2, a block diagram conceptually illustrating an electronic device that comprises a corrugated thermal interface device in accordance with various aspects of the present disclosure is described. It should be understood that FIG. 2 is not intended to illustrate specific shapes, dimensions, or other structural details accurately or to scale, and that implementations of the electronic device 200 may have different numbers and arrangements of the illustrated parts and may also include other parts that are not illustrated. Various components of the electronic device 200 may be similar to components of the system 100 described above. The above descriptions of various components of the system 100 are applicable to the similar components of the electronic device 200, and thus duplicative descriptions are omitted below to improve clarity.

The electronic device 200 comprises a chassis 211, a set of fins 212, electronic circuitry 213, a connector 214, and a corrugated thermal interface device 230. The chassis 211 comprises a structure that supports and/or houses the other parts of the device 200. The chassis 211 is configured to removably couple with another electronic device (not illustrated). For example, in some examples the other electronic device is a pluggable auxiliary device and the chassis 211 is configured to removably couple with the other electronic device by removably receiving at least part of the other electronic device within a receptacle (not illustrated) defined by the chassis 211. In such examples, the electronic device 200 may be similar to the first electronic device 110 described above. In other examples, the electronic device 200 is a pluggable auxiliary device and the chassis 211 is configured to couple with the other electronic device by being removably received within a receptacle of the other electronic device. In such examples, the electronic device 200 may be similar to the second electronic device 120 described above. The electronic circuitry 213 may be similar to the electronic circuitry 113 and/or 123 described above. The connector 214 may be similar to the connectors 114 and/or 124 described above.

The corrugated thermal interface device 230 may be similar to the corrugated thermal interface device 130 described above. The corrugated thermal interface device 230 comprises a plurality of folded fins 231 (which may be similar to the folded fins 131) and a plurality of spring fingers 232 (which may be similar to the spring fingers 132) extending laterally from lateral walls of the folded fins 231. The folded fins 231 define a first set of grooves 241 (similar to the grooves 141) on a first side of the corrugated thermal interface device 230 and define a second set of grooves 242 (similar to the grooves 142) on a second side of the corrugated thermal interface device 230. Each spring finger 232 extends into one of grooves 242.

As shown in FIG. 2, the corrugated thermal interface device 230 is engaged with the fins 212. Specifically, the fins 212 are received within the first set of grooves 241. Moreover, the corrugated thermal interface device 230 is affixed to the fins 212. The fins 212 may be similar to the fins 112 or 122 described above. In examples in which the electronic device 200 is a pluggable auxiliary device, the fins 212 may be thermally coupled to the electronic circuitry 213 to remove heat therefrom. In examples in which the other electronic device is a pluggable auxiliary device that the electronic device 200 is to receive, the fins 212 may be thermally coupled to a cold plate (not illustrated) of the electronic device 200 such that the cold plate can remove heat from the fins 212.

In some examples, the corrugated thermal interface device 230 is configured to removably engage with another set of fins (not illustrated) of the other electronic device when the other electronic device is coupled with the electronic device 200. The other set of fins is removably engaged with the corrugated thermal interface device 230 by being removably received within the second set of grooves 242 and coming into contact with the spring fingers 232, in a manner similar to that described above in relation to the corrugated thermal interface device 130. If the electronic device 200 is a pluggable auxiliary device, the other set of fins of the other electronic device may be thermally coupled to a cold plate of the other electronic device. If, on the other hand, the electronic device 200 is a primary device that removably receives a pluggable auxiliary device, the other set of fins of the pluggable auxiliary electronic device may be thermally coupled with electronic circuitry of the pluggable auxiliary device to remove heat therefrom. In either case, when the electronic device 200 is coupled with the other electronic device, the fins 212, corrugated thermal interface device 230, and other fins of the other electronic device form a conductive thermal pathway to transfer heat from a heat source (which may be the electronic circuitry 213 of the electronic device 200 in some examples or electronic circuitry of the other electronic device in other examples) to a cold plate (which may be part of the other electronic device in some examples or part of the electronic device 200 in some examples).

Turning now to FIGS. 3-14, a corrugated thermal interface device 330 (see FIGS. 7-12), a pluggable auxiliary device 320 with the corrugated thermal interface device 330 affixed thereto (see FIGS. 3, 4, and 13), and a system 300 comprising the pluggable auxiliary device 320, the corrugated thermal interface device 330, and an electronic device 310 (see FIGS. 5, 6, and 14) in accordance with various aspects of the disclosure will be described. Although an assembly comprising the corrugated thermal interface device 330 affixed to the pluggable auxiliary device 320 is described below together, the corrugated thermal interface device 330 could be provided separately from the pluggable auxiliary device 320 and could be used with other devices in other examples. Moreover, the assembly of the pluggable auxiliary device 320 with the corrugated thermal interface device 330 affixed thereto could be provided separately from the electronic device 310 and could be used with other devices besides the electronic device 310.

The system 300 may be used as (e.g., is one configuration of) the system 100 described above. Similarly, the corrugated thermal interface device 330 is one configuration of the corrugated thermal interface device 130 described above. Furthermore, the assembly comprising the pluggable auxiliary device 320 with the corrugated thermal interface device 330 attached thereto is one example of the pluggable auxiliary device 120 with the corrugated thermal interface device 130 attached thereto. Thus, various components of the system 300 may be similar to components of the system 100 described above. The above descriptions of components of the system 100 are applicable to the similar components of the system 300, and thus duplicative descriptions are omitted below to improve clarity. Similar components of the systems 100 and 300 are given reference numbers having the same last two digits, such as 110 and 310. Although the system 300 may be one configuration of the system 100, the system 100 is not limited to the system 300.

Various elements of the system 300 or components thereof are illustrated in multiple figures. As elements are described below, one or a few figures which are thought to be particularly pertinent to the element being described will be noted, and thus the description below will not necessarily describe FIGS. 3-14 separately and in strict sequence but will instead move back and forth between various figures. In addition, it should be understood that when certain figures are referred to in relation to a particular element, other figures besides those that are identified may also illustrate the same part from other perspectives.

Figure 3:
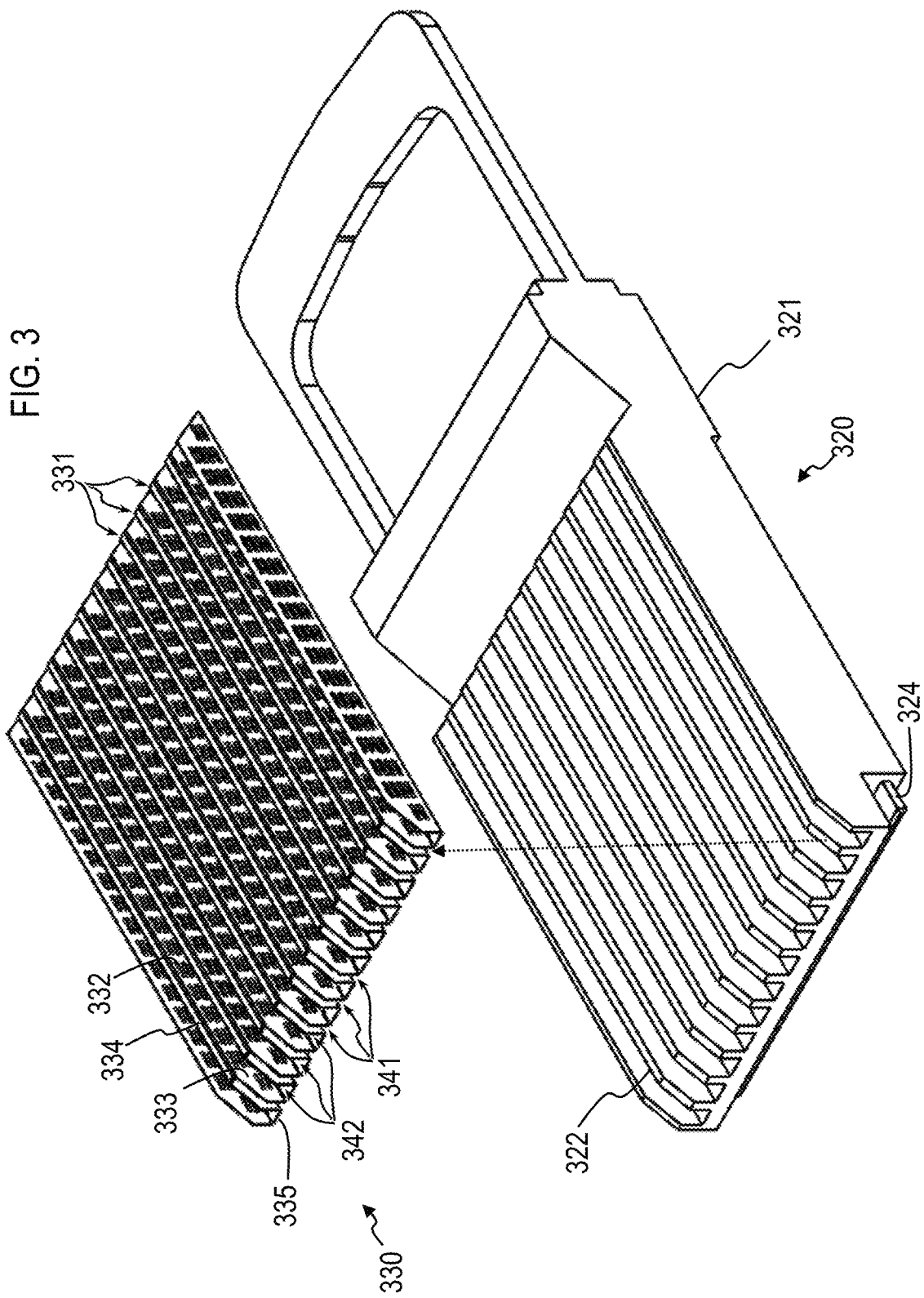
FIG. 3 is a perspective view of an example pluggable auxiliary device and an example corrugated thermal interface device in a disassembled state.
Figure 4:
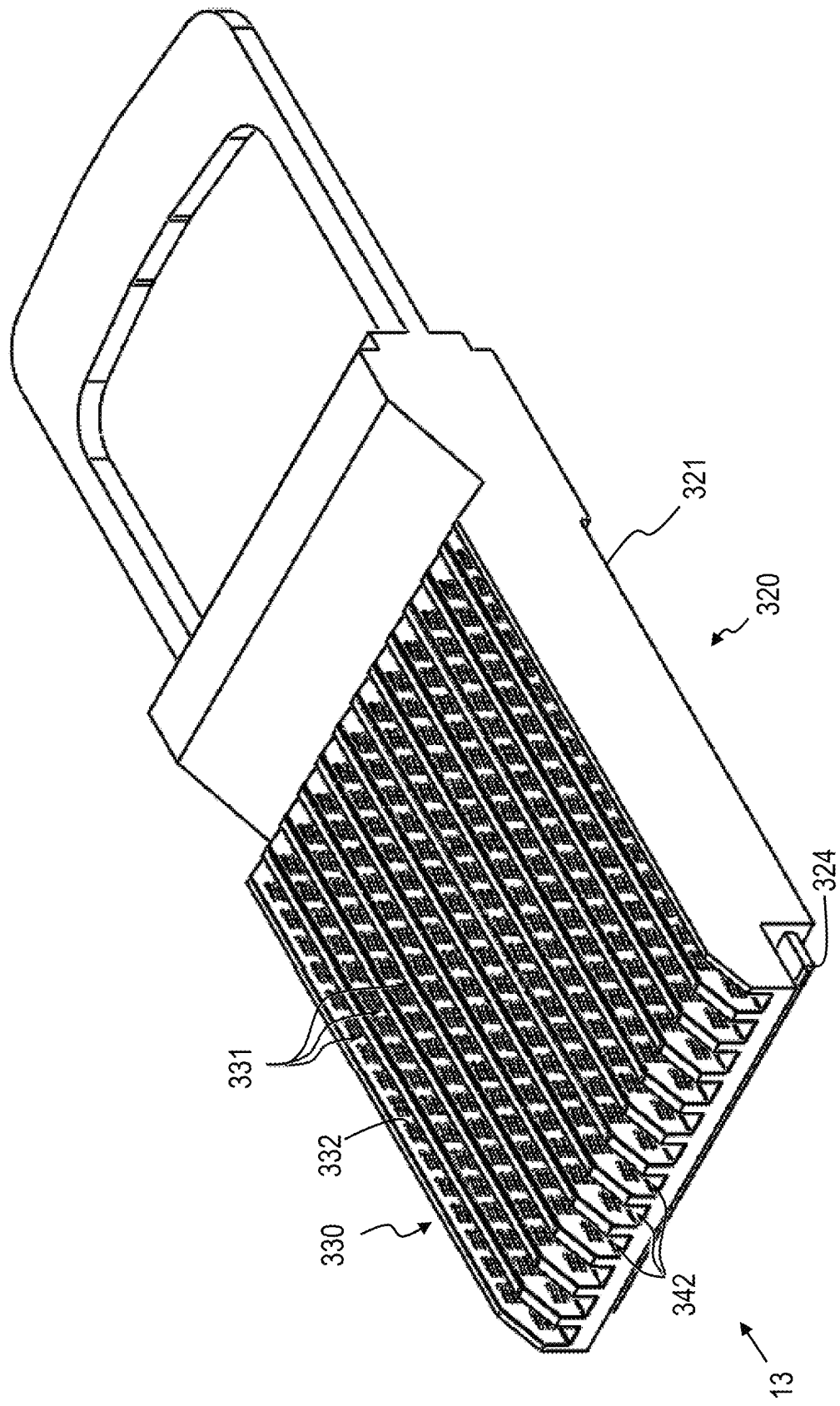
FIG. 4 is a perspective view of the pluggable auxiliary device and the corrugated thermal interface device of FIG. 3 in an assembled state.
Figure 5:
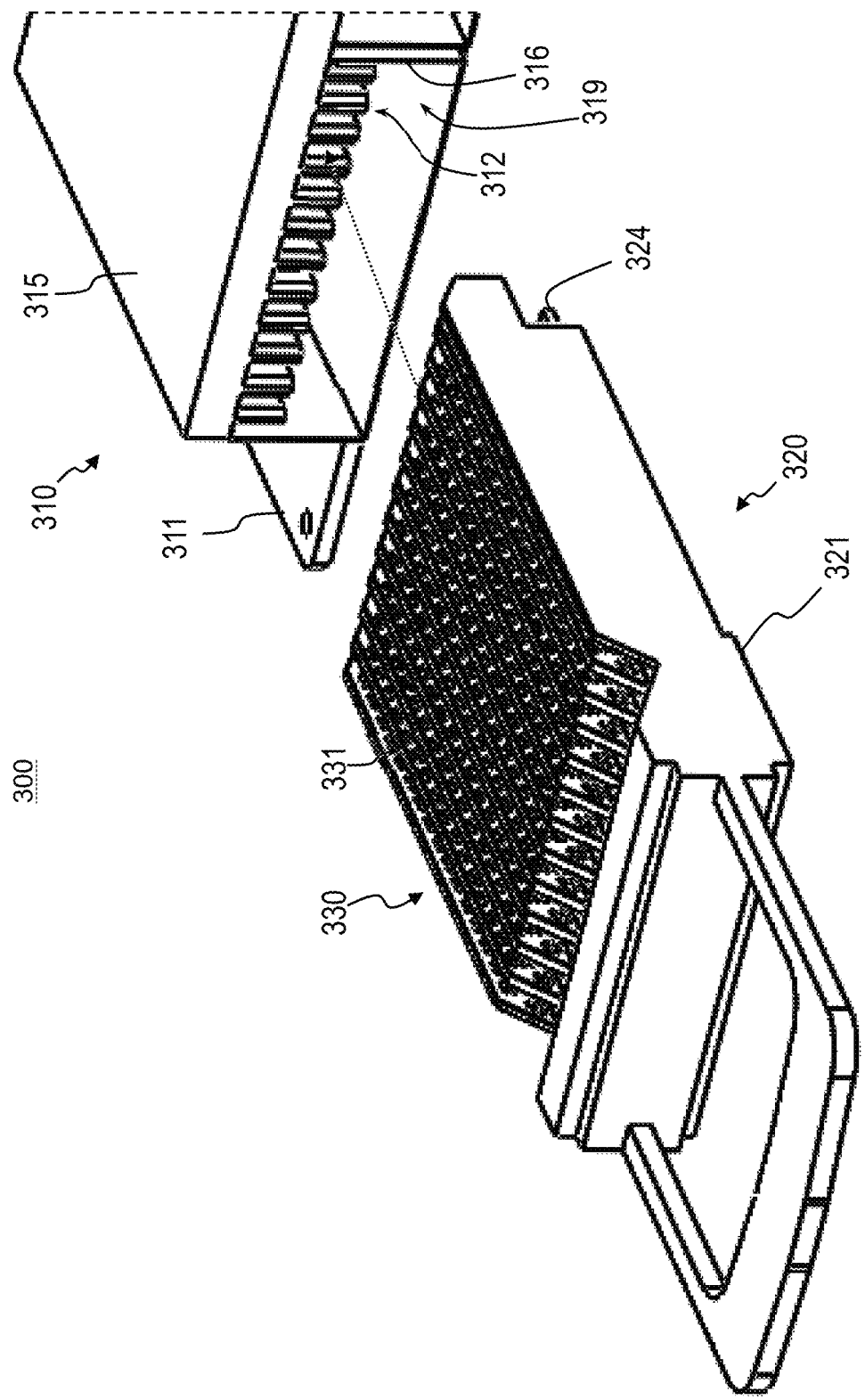
FIG. 5 is a perspective view of a system comprising the pluggable auxiliary device and the corrugated thermal interface device of FIG. 3 and an electronic device in an unplugged state of the pluggable auxiliary device.

In FIGS. 3-5, a pluggable auxiliary device 320 comprising a chassis 321, a set of fins 322, and a connector 324 is illustrated. The pluggable auxiliary device 320 may be used as the second electronic device 120 described above. The pluggable auxiliary device 320 may also comprise electronic circuitry (not visible) housed within the chassis 321, which may be similar to the electronic circuitry 123 described above. The fins 322 are part of (i.e., integrally coupled to) the chassis 321. For example, the fins 322 and the portion of the chassis 321 integrally coupled therewith may be formed by extrusion of a piece of metal into the desired shape. The connector 324 is an electronic connector (e.g., a PCB gold-finger connector) comprising electronic contacts. The pluggable auxiliary device 320 also comprises electronic circuitry (not illustrated), which is supported by and/or housed within the chassis 321 and thermally coupled to the fins 322. The electronic circuitry may be similar to the electronic circuitry 113 described above.

The pluggable auxiliary device 320 is configured to engage with a corrugated thermal interface device 330, which can be affixed to the set of fins 322 in an assembled state. The corrugated thermal interface device 330 may be used as the corrugated thermal interface device 130 or 230 described above. FIG. 3 illustrates the pluggable auxiliary device 320 and the corrugated thermal interface device 330 in an unassembled state, while FIGS. 4 and 13 illustrate the pluggable auxiliary device 320 and the corrugated thermal interface device 330 in an assembled state with the corrugated thermal interface device 330 affixed to the pluggable auxiliary device 320. The pluggable auxiliary device 320 together with the corrugated thermal interface device 330 affixed thereto may be used as the electronic device 200 described above.

Figure 6:
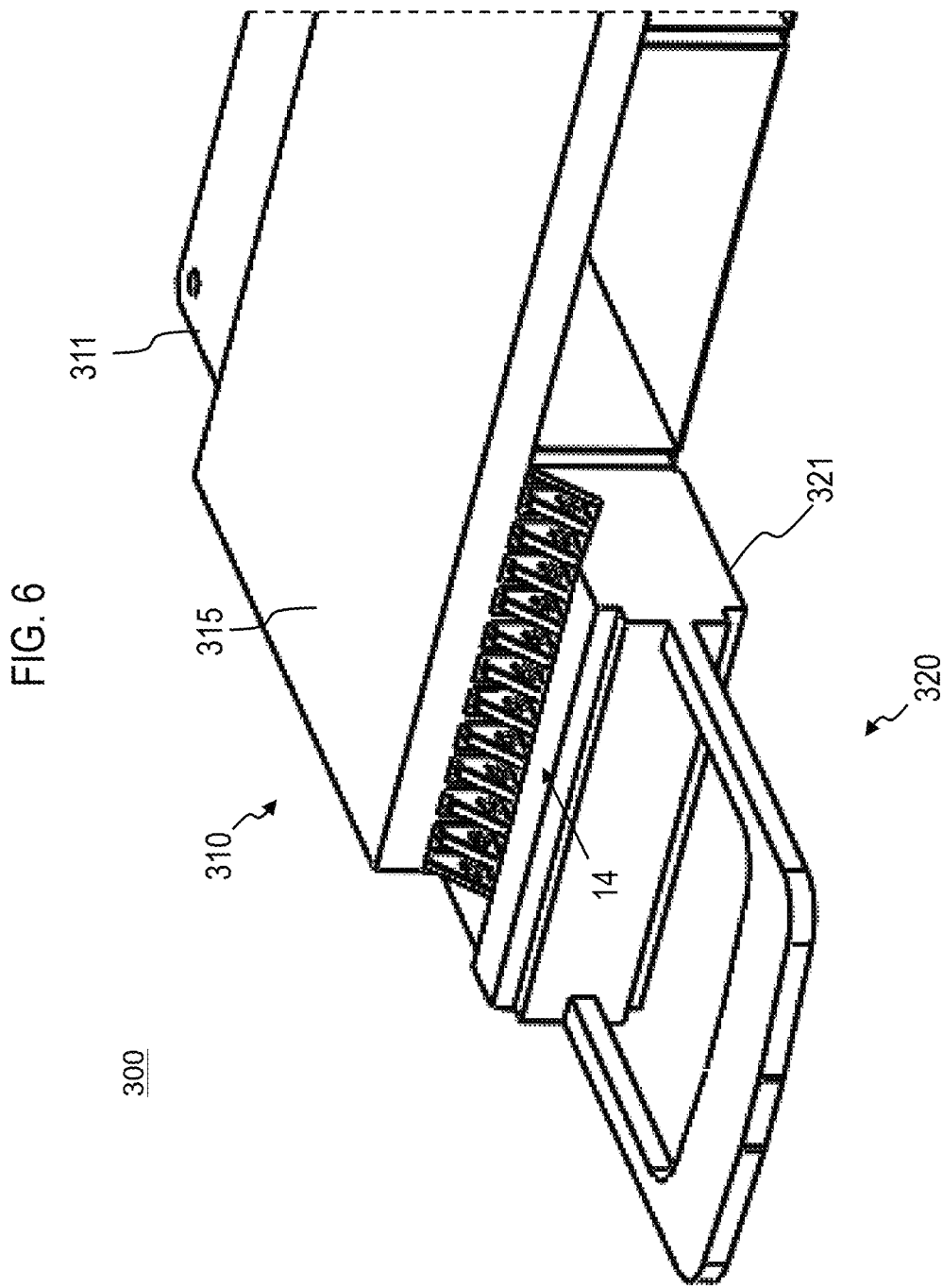
FIG. 6 is a perspective view of the system of FIG. 3 in a plugged-in state of the pluggable auxiliary device.

As shown in FIGS. 5 and 6, the pluggable auxiliary device 320 with the corrugated thermal interface device 330 affixed thereto may be usable in conjunction with an electronic device 310, and together these devices form a system 300 in accordance with various aspects of the disclosure. The electronic device 310 may be used as the first electronic device 110. As shown in FIG. 5, the electronic device 310 also comprises a chassis 311, a set of fins 312, and a cold plate 315. The pluggable auxiliary device 320 is configured to be removably plugged into the electronic device 310 by insertion into a receptacle 316 of the electronic device 310. FIG. 5 illustrates the pluggable auxiliary device 320 (with corrugated thermal interface device 330 affixed thereto) in an unplugged state outside of the receptacle 316, while FIGS. 6 and 14 illustrate the pluggable auxiliary device 320 in a plugged-in (received) state inside of the receptacle 316.

The chassis 311 supports and/or houses components of the electronic device 310. Moreover, the chassis 311 comprises the aforementioned receptacle 316. As shown in FIG. 5, the receptacle 316 may comprise a number of walls at least partially enclosing a volume 319. When the pluggable auxiliary device 320 is plugged into the receptacle 316, the pluggable auxiliary device 320 is inserted through an opening of the receptacle 316 and is received at least partially in the volume 319. In some examples, the opening of the receptacle 316 may be exposed to an exterior of the electronic device 310 (e.g., may be positioned in at an exterior wall of the chassis 311) so that the pluggable auxiliary device 320 can be inserted from an exterior of the electronic device 310 into the volume 319. The electronic device 310 may also comprise a connector (not illustrated) configured to engage with the connector 324 of the pluggable auxiliary device 320 (or to be positioned in sufficient proximity to exchange signals) to communicably couple the pluggable auxiliary device 320 to electronic circuitry of the electronic device 310. The chassis 311 may also include additional components besides those illustrated in FIG. 5, which are omitted from the figure to ease description and avoid obscuring other elements. Examples of such addition components of the chassis 311 may include additional receptacles for other types of pluggable devices, support structures, compartments for supporting and/or housing other components of the electronic devices 310, an outer housing comprising walls that enclose the various other parts of the electronic device 310, and so on as would be familiar to those of ordinary skill in the art.

The fins 312 are thermally coupled to the cold plate 315 and extend into the receptacle 316 (i.e., the fins extend into and are exposed to the volume 319). The cold plate 315 is part of a liquid cooling loop and during operation of the device 320 is thermally coupled to a flow of liquid coolant. In some examples, the flow of liquid coolant is exposed directly to the cold plate 315. For example, the cold plate 315 may have one or more passages (not illustrated) extending through the cold plate 315 through which liquid coolant flows such that the liquid coolant is exposed to internal surfaces of the cold plate. In another arrangement, an exterior surface of the cold plate 315 may form one boundary of a liquid chamber defined by the cold plate 315 and a cover coupled thereto, with the liquid coolant flowing through the liquid chamber and being exposed to the exterior surface of the cold plate 315. In other examples, the cold plate 315 is thermally coupled to a separate vessel (e.g., tube) that carries the flow of liquid coolant and transfers heat into the liquid coolant via conduction through the separate vessel. The electronic device 310 may also comprise electronic circuitry (not illustrated), which may be similar to the electronic circuitry 113 described above. In some arrangements, the electronic circuitry is also cooled by the liquid cooling loop, such as, for example, by the same flow of liquid coolant that cools the cold plate 315. As shown in FIG. 6, the cold plate 315 may also extend beyond the receptacle 316 to cool other components. For example, the cold plate 315 may extend over a bank of multiple receptacles, which may be similar to the receptacle 316 or different therefrom, so that the cold plate 315 can simultaneously remove heat from multiple pluggable auxiliary devices plugged into the electronic device 310. Various other parts of the electronic device 310 have been omitted from the Figures to improve visibility of other parts, but those having ordinary skill in the art would appreciate that the electronic device 310 may have such parts.

As shown in FIGS. 5, 6, and 14, in a state of the pluggable auxiliary device 320 plugged into the electronic device 310, the two sets of fins 312 and 322 interleave with one another with the corrugated thermal interface device 330 disposed between and engaged with both sets of fins 312 and 322. In this illustrated system, to plug the pluggable auxiliary device 320 into the receptacle 316, the pluggable auxiliary device 320 is moved along a direction substantially parallel to a longitudinal dimension of the folded fins 331, as indicated by the dashed arrow in FIG. 5, such that the fins 312 of the electronic device 310 slide in between the fins 322 of the pluggable auxiliary device 320 (the fins 312 also slide in between the folded fins 331 and into the second set of grooves 342, which are described in greater detail below).

Figure 7:
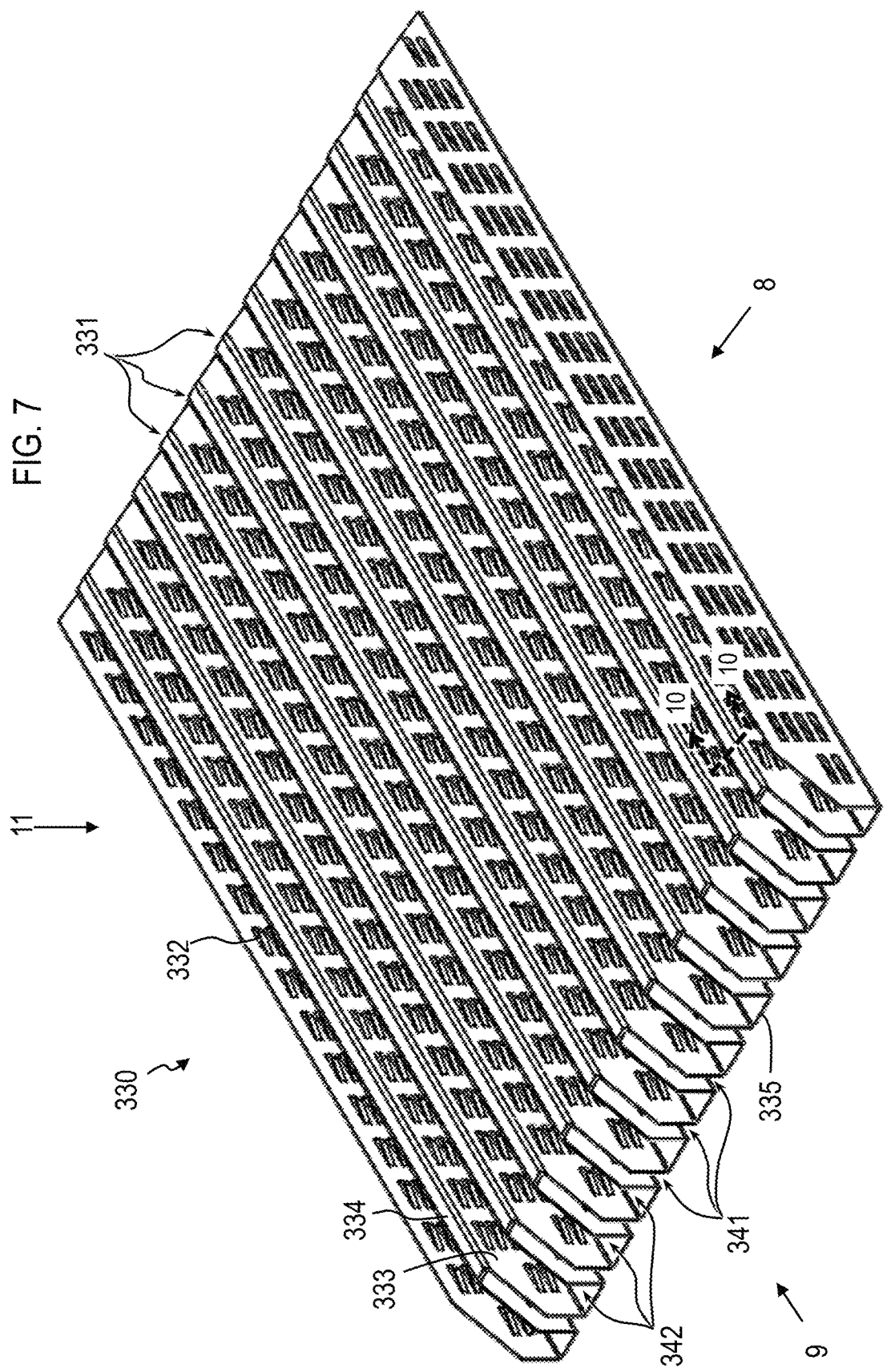
FIG. 7 is a perspective view of the corrugated thermal interface device of FIG. 3.
Figure 8:
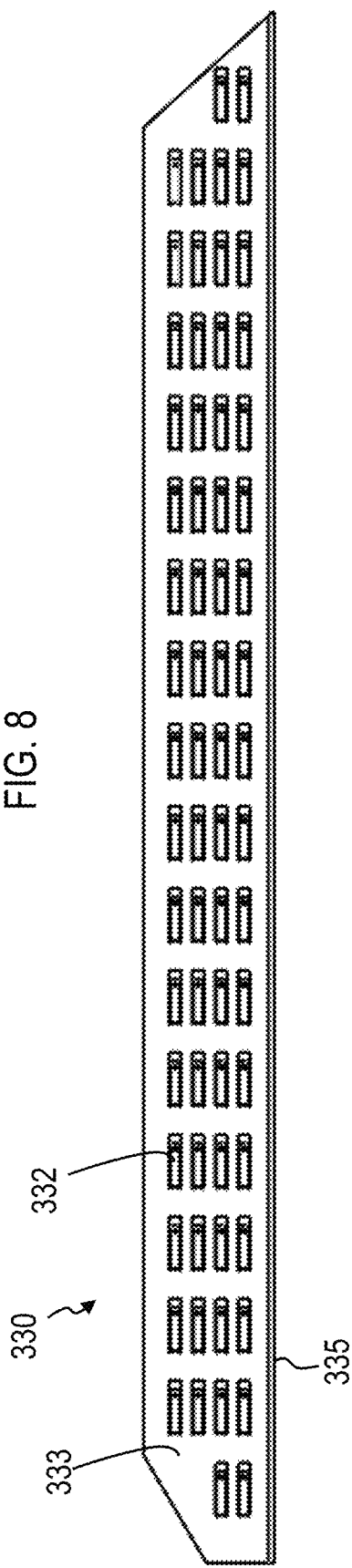
FIG. 8 is a side view of the corrugated thermal interface device of FIG. 7 from the perspective indicated by the arrow 8.
Figure 9:
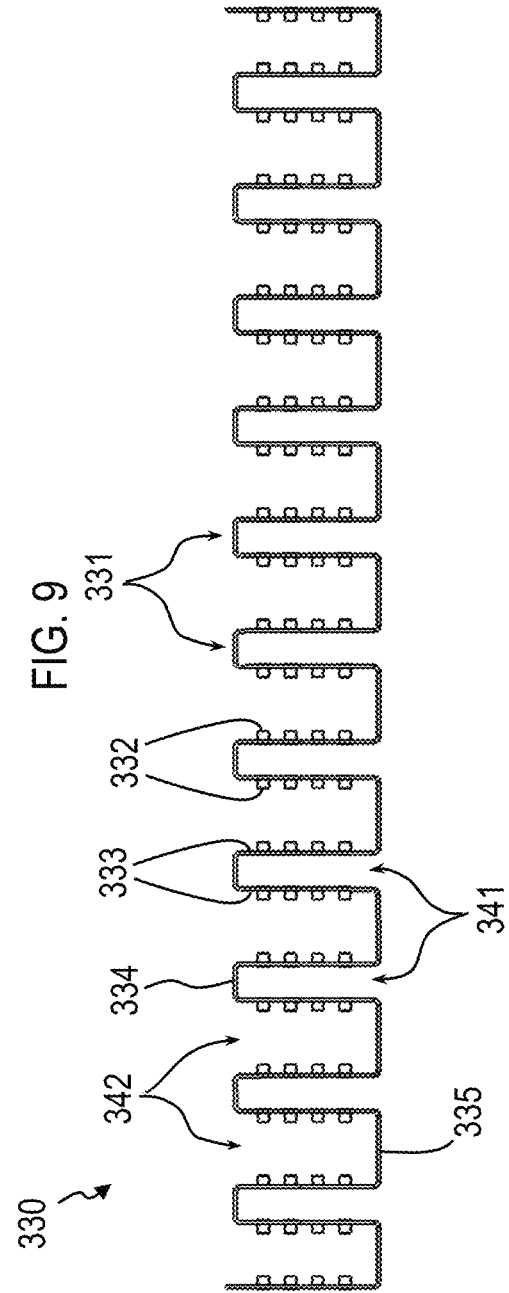
FIG. 9 is a front view of the corrugated thermal interface device of FIG. 7 from the perspective indicated by the arrow 9.

As shown in FIGS. 7-12, the corrugated thermal interface device 330 comprises a plurality of folded fins 331 (only some are labeled in the Figures) and a plurality of spring fingers 332 (only some are labeled in the Figures) coupled to and extending laterally from the folded fins 331. More specifically, as shown in FIGS. 7 and 9, each folded fin 331 comprises a pair of lateral walls 333 (only some are labeled in the Figures), which are coupled together at a first end thereof by a first end portion 334 (excluding, in some examples, one or both outermost fins 331 which may comprise a single lateral wall 333). Adjacent folded fins 331 are coupled together at a second end thereof by a second end portion 335. As shown in FIGS. 8 and 9, extending from each lateral wall 333 and into a groove 342 bounded by adjacent folded fins 331, as described further below, is a subset of the plurality of spring fingers 332. As shown in FIGS. 7-12, spring fingers 332 are arranged in multiple rows and columns. The number and arrangement of spring fingers 332 per lateral wall 333 may vary from that depicted as would be appreciated by those of ordinary skill in the art.

Figure 10:
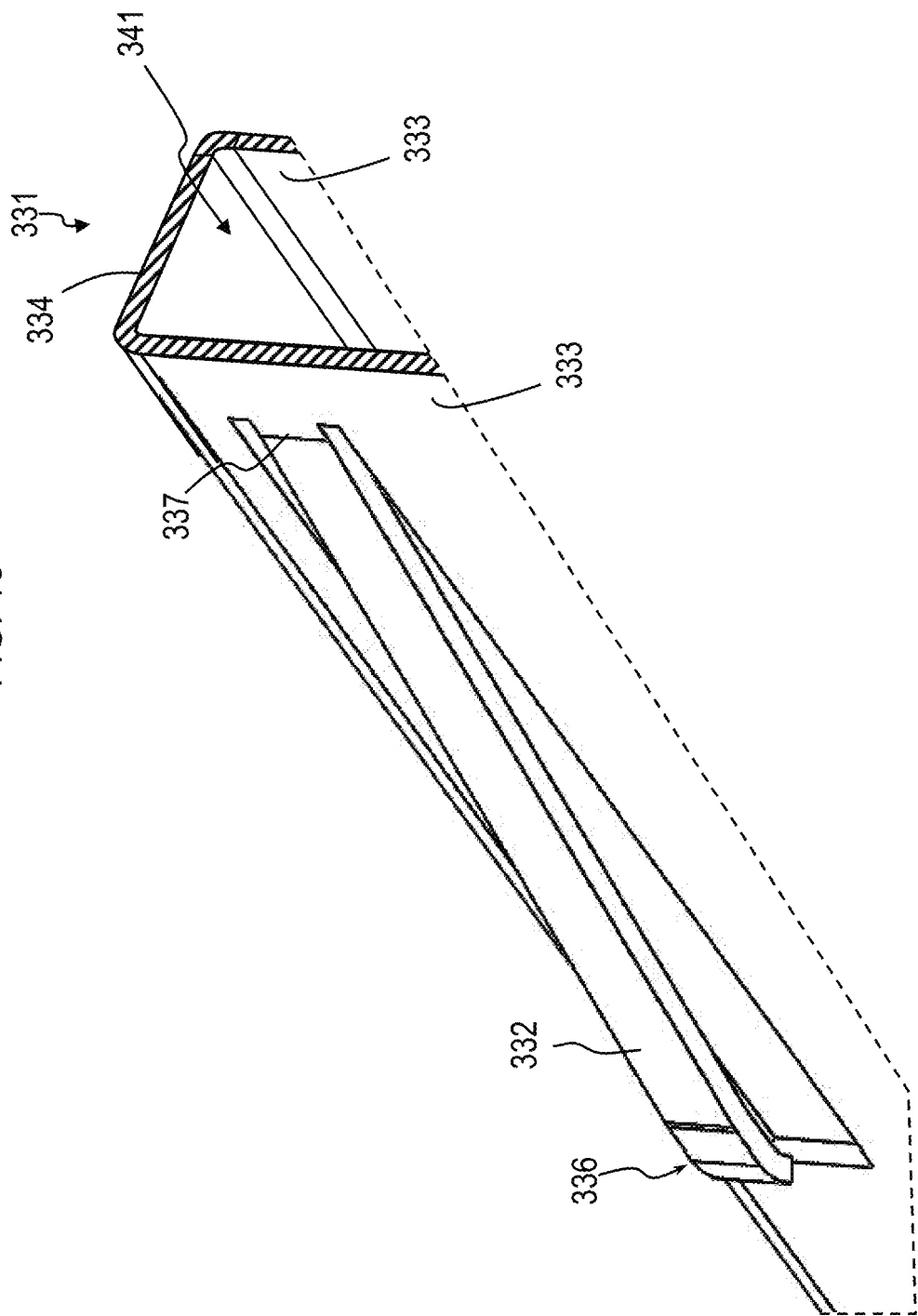
FIG. 10 is an enlarged perspective sectional view of a portion of the corrugated thermal interface device of FIG. 7 with the section taken along 10-10 in FIG. 7.

As shown in FIGS. 7, 9, and 10, the folded fins 331 define a first set of grooves 341 (also referred to as "first grooves") on a first side of the corrugated thermal interface device 330 (e.g., on a bottom side thereof in the orientation illustrated in FIGS. 3-14), with each first groove 341 being defined by the two lateral walls 333 and the first end portion 334 of a corresponding folded fin 331. As shown by the dashed-lined arrow in FIG. 3, these first grooves 341 are configured to receive the fins 322 of the pluggable auxiliary device 320, resulting in the engaged state illustrated in FIGS. 4 and 13. The corrugated thermal interface device 330 is affixed to the fins 322 in this engaged state (e.g., by welding, soldering, brazing, adhesives, friction fitting, mechanical fasteners, and/or other similar affixation techniques). As shown in FIG. 13, in the engaged and affixed state of the corrugated thermal interface device 330 to the fins 322, the fins 322 are in contact with the lateral walls 333 of the folded fins 331.

As shown in FIGS. 7, 9, and 13, the folded fins 331 also define a second set of grooves 342 (also referred to as "second grooves") on a second side of the corrugated thermal interface device 330 (e.g., on a top side thereof in the orientation illustrated in FIGS. 3-14), with each second groove 342 being defined by lateral walls 333 of two adjacent folded fins 331 and by a second end portion 335 coupling those folded fins 331 together. The second grooves 342 are configured to removably receive the fins 312 of the electronic device 310 when the pluggable auxiliary device 320 is plugged into the receptacle 316, as shown in FIG. 14.

Figure 11:
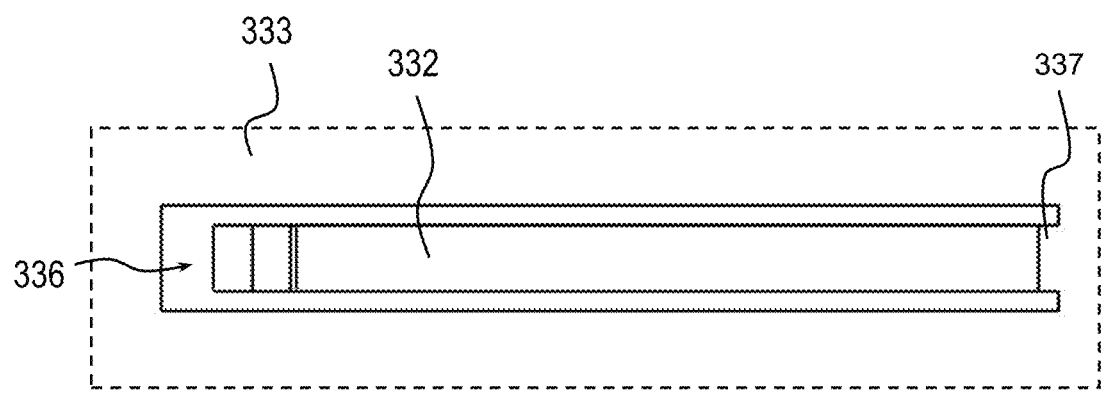
FIG. 11 is an enlarged top view of a portion of the corrugated thermal interface device of FIG. 7 from the perspective indicated by the arrow 11.
Figure 12:
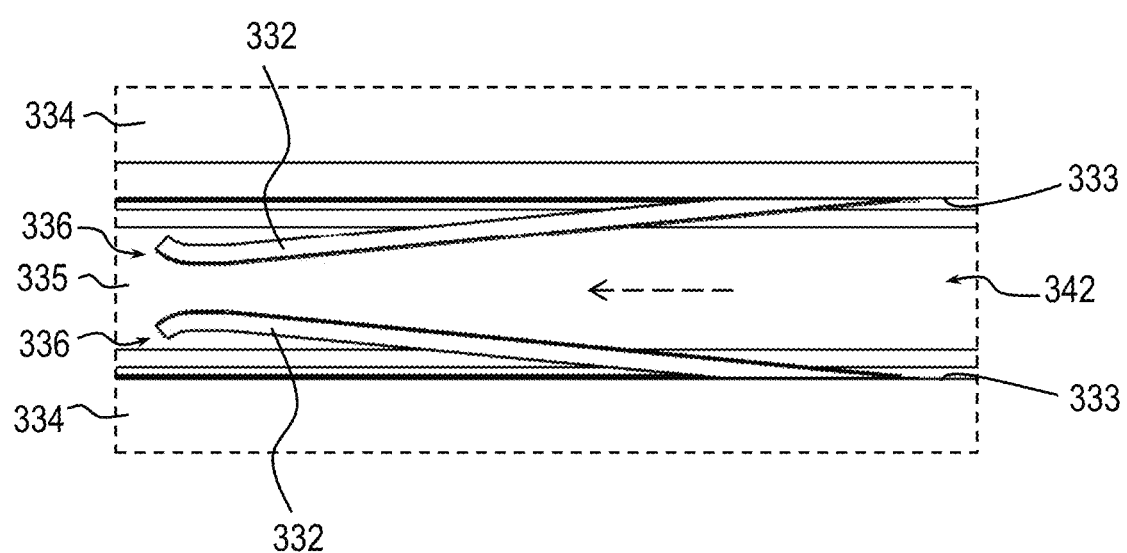
FIG. 12 is an enlarged side view of a portion of the corrugated thermal interface device of FIG. 7 from the perspective indicated by the arrow 8.

As shown in FIGS. 7-12, the spring fingers 332 are integrally coupled to the lateral walls 333 and extend therefrom into the second grooves 342. The spring fingers 332 protrude into the second grooves 342 such that the fins 312 of the electronic device 310 make contact with and laterally displace the spring fingers 332 as the fins 312 are received within the grooves 342. FIGS. 10-12 illustrate a configuration of the spring fingers in accordance with aspects of the disclosure in detail. As shown in FIGS. 10 and 11, the spring finger 332 has an attached end 337 that is integrally coupled with the lateral wall 333 and a free end 336. As shown in FIGS. 10 and 12, the spring finger 332 is bent away from the lateral wall 333 near the attached end 337 such that the spring finger 332 extends at an angle away from the lateral wall 333. The spring finger 332 is angled relative to the lateral wall 333 so that the fins 312 can slide relatively easily past the spring finger 332 as a fin 312 is inserted into the second groove 342 along the direction of the dash-lined arrow in FIG. 12. Moreover, the spring finger 332 is also bent back towards the lateral wall 333 near the free end 336 of the spring finger 332, so as to allow the fin 312 to easily slide backward past the spring finger 332 in a direction opposite the dash-lined arrow in FIG. 12 without the fin 312 catching on the free end 336 of the spring finger 332 as the fin 312 is removed from the second groove 342. The bent-back portion near the free end 336 may also provide a relatively flat contact surface for the spring finger 332, which may improve the contact area between the spring finger 332 and the fin 312. The spring finger 332 may be formed by cutting a portion of the lateral wall 333 into the general profile of the spring finger 332 while leaving one end of this portion uncut (this end becoming the attached end 337), and then bending the cut portion such that the free end 336 moves laterally away from the rest of the lateral wall 333 until the desired shape of the spring finger 332 is attained.

As noted above, although the pluggable auxiliary device 320 with the corrugated thermal interface device 330 affixed thereto was described above in the context of the system 300 and in association with the electronic device 310 to aid in understanding, the pluggable auxiliary device 320 with the corrugated thermal interface device 330 affixed thereto could be provided (e.g., made, sold, used, offered for sale) by itself without necessarily being packaged together with any other devices. Moreover, the pluggable auxiliary device 320 with the corrugated thermal interface device 330 affixed thereto could be used in conjunction with electronic devices other than the electronic device 310. The pluggable auxiliary device 320 with the corrugated thermal interface device 330 affixed thereto may be used as the electronic device 200 described above.

Turning now to FIGS. 15-20, a cold plate comprising a corrugated thermal interface device affixed thereto (see FIGS. 15 and 16), an electronic device comprising the cold plate assembly (see FIG. 17), and a system comprising the electronic device and a pluggable auxiliary device (see FIGS. 18-20) in accordance with aspects of the disclosure will be described. For ease of description, the cold plate, the corrugated thermal interface device, the electronic device, and the pluggable auxiliary device are described together below in the context of a system, but those having ordinary skill in the art would appreciate the cold plate with the corrugated thermal interface device affixed thereto could be provided separately from the electronic device and/or the pluggable auxiliary device and could be used in conjunction with other types of electronic devices and/or pluggable electronic devices.

Figure 18:
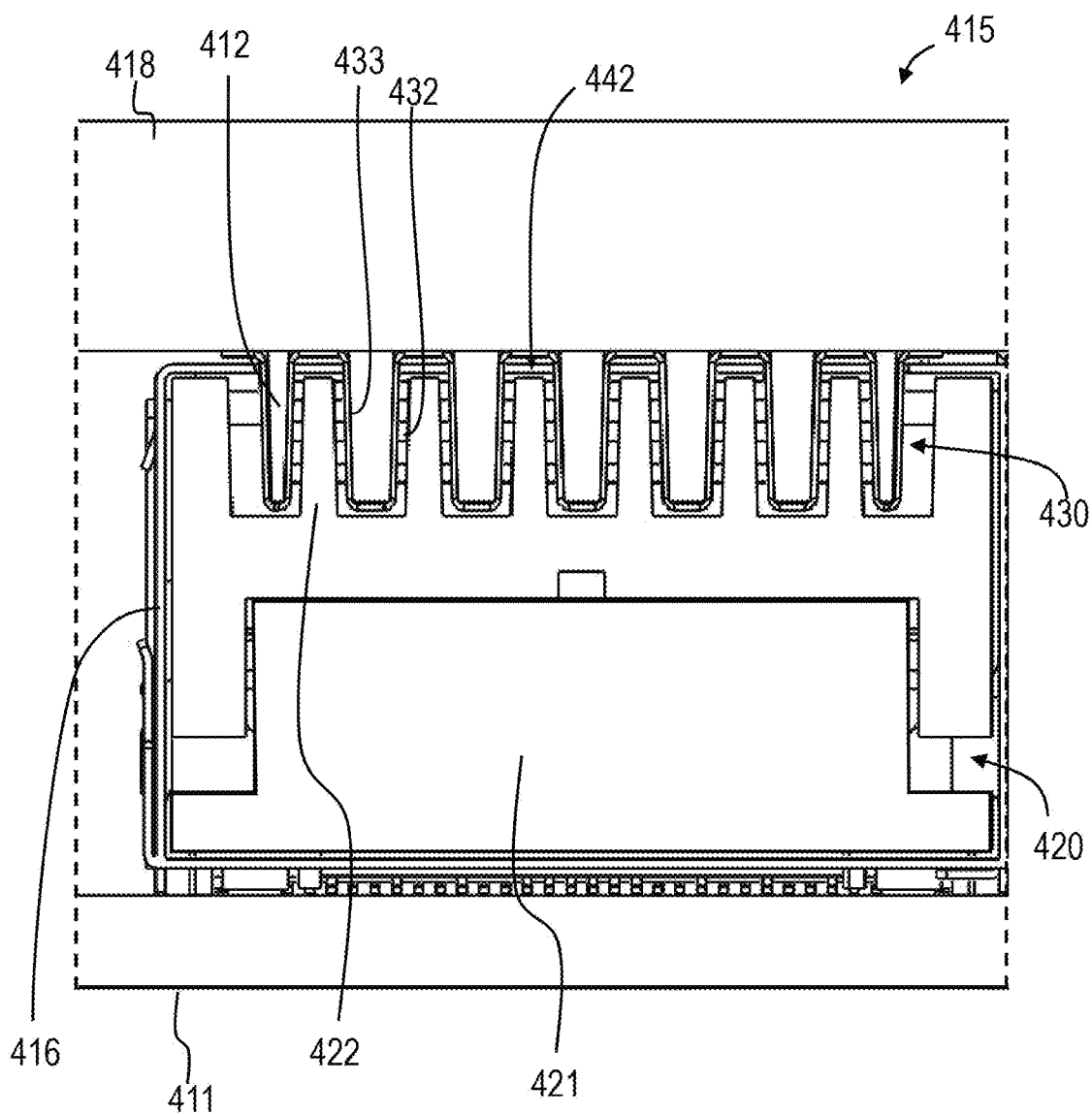
FIG. 18 is a front view of a portion of an example system comprising a pluggable electronic device and the electronic device of FIG. 17 in a plugged-in state of the pluggable electronic device.
Figure 19:
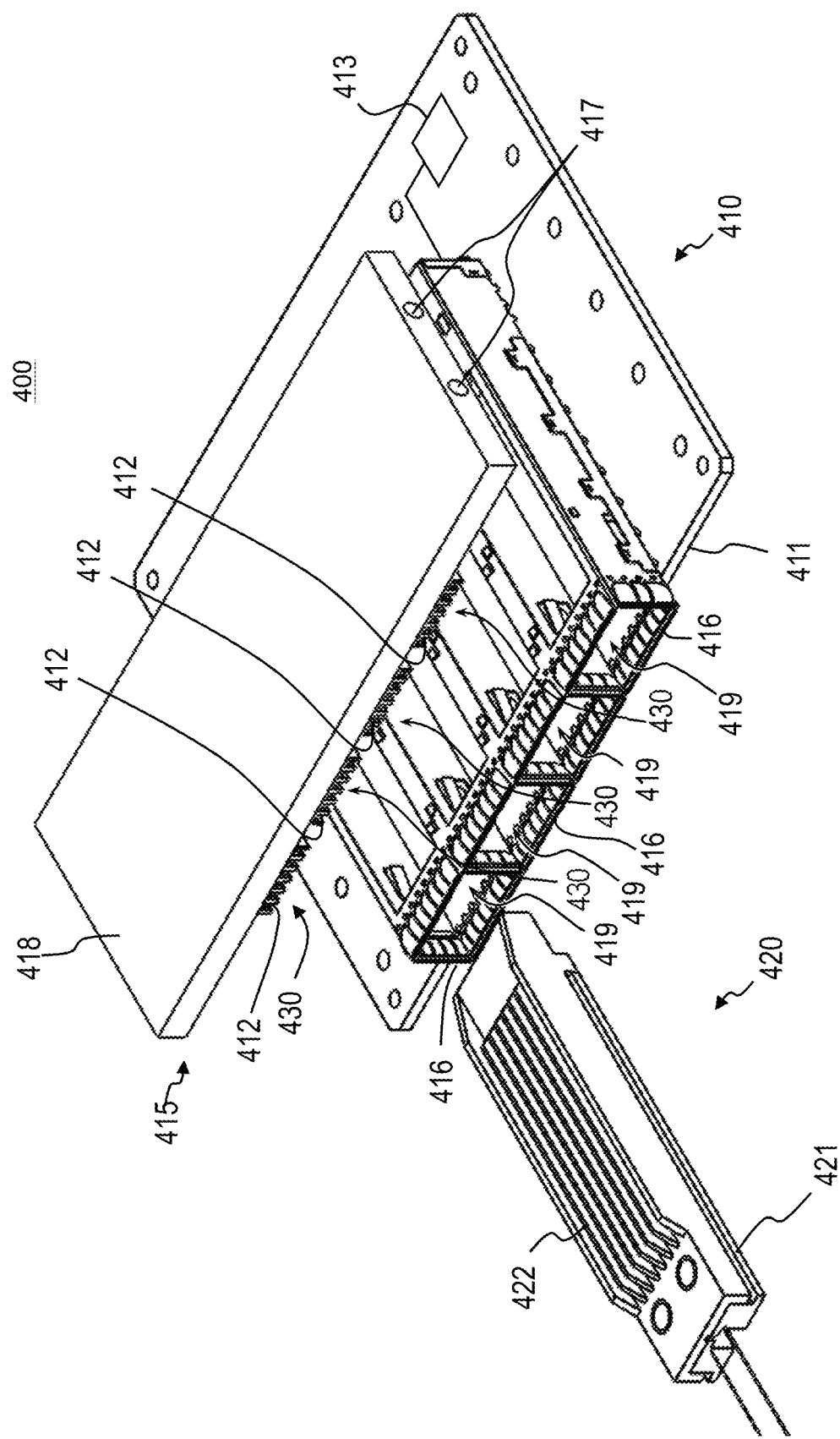
FIG. 19 is a perspective view of the system of FIG. 18 in an unplugged state of the pluggable electronic device.
Figure 20:
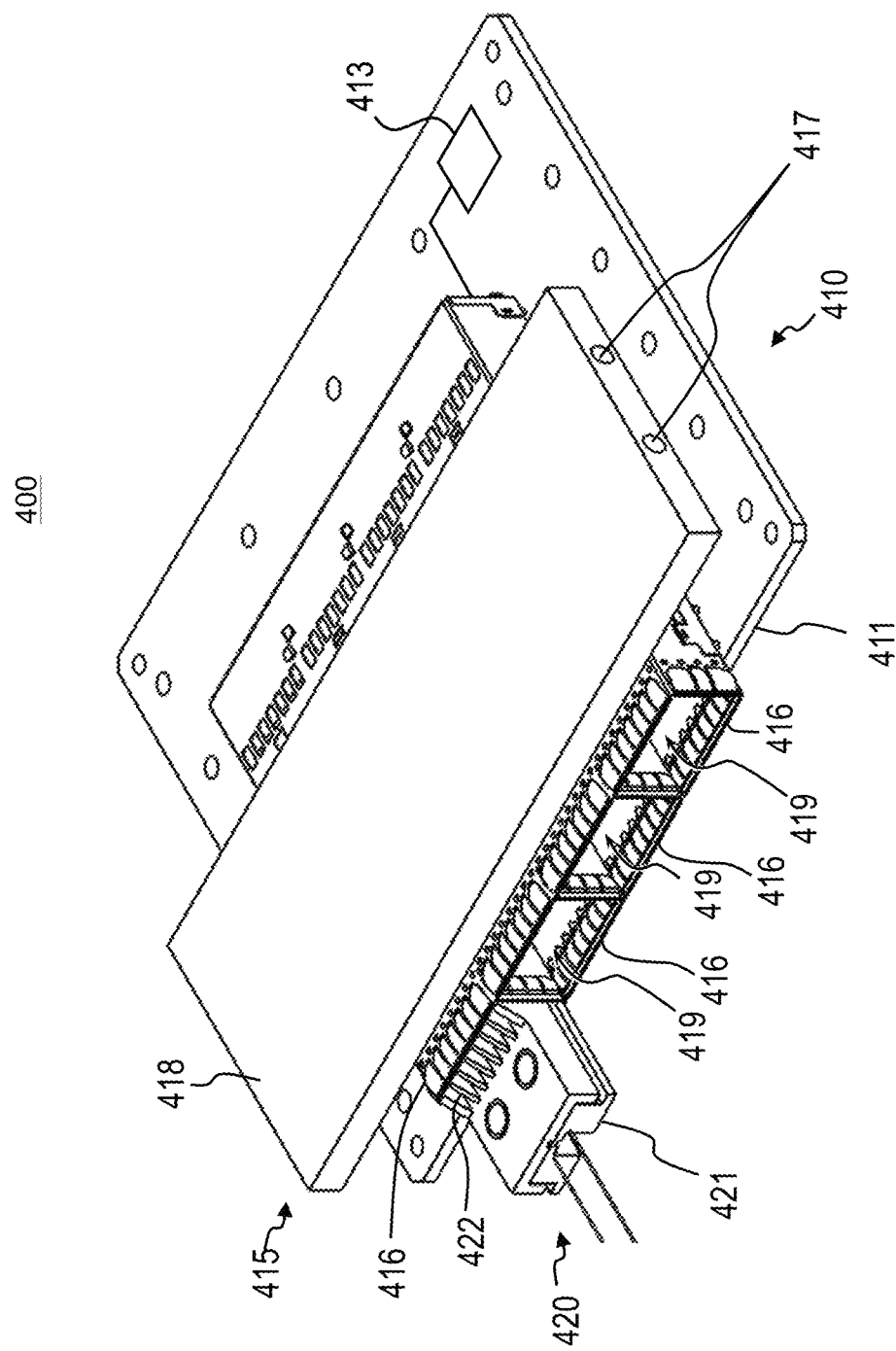
FIG. 20 is a perspective view of the system of FIG. 18 in the plugged-in state of the pluggable electronic device.

The system 400 illustrated in FIGS. 18-20 may be used as (e.g., is one example of) the system 100 described above. Similarly, the corrugated thermal interface device 430 is one configuration of the corrugated thermal interface device 130 described above. Furthermore, the assembly comprising the cold plate 415 with the corrugated thermal interface device 430 attached thereto is one example of the cold plate 115 with the corrugated thermal interface device 130 attached thereto. Thus, various components of the system 400 may be similar to components of the system 100 described above. The above descriptions of components of the system 100 are applicable to the similar components of the system 400, and thus duplicative descriptions are omitted below to improve clarity. Similar components of the systems 100 and 400 are given reference numbers having the same last two digits, such as 110 and 410. Although the system 400 may be one example of the system 100, the system 100 is not limited to the system 400.

Various elements of the system 400 or components thereof are illustrated in multiple figures. As elements are described below, one or a few figures which are thought to be particularly pertinent to the element being described will be noted, and thus the description below will not necessarily describe FIGS. 15-20 separately and in strict sequence but will instead move back and forth between various figures. In addition, it should be understood that when certain figures are referred to in relation to a particular element, other figures besides those that are identified may also illustrate the same part from other perspectives.

Figure 15:
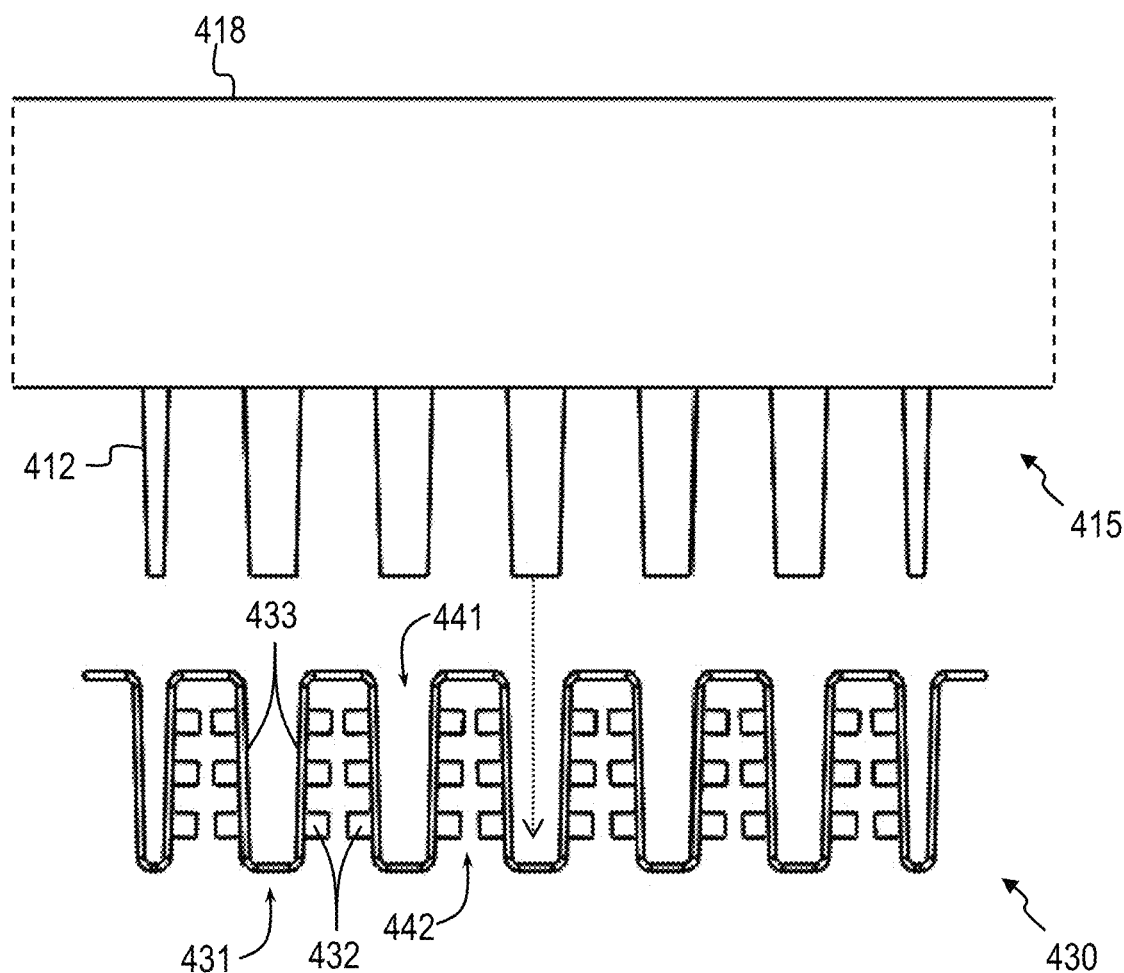
FIG. 15 is a front view of a portion of an example cold plate and an example corrugated thermal interface device in an unassembled state.
Figure 16:
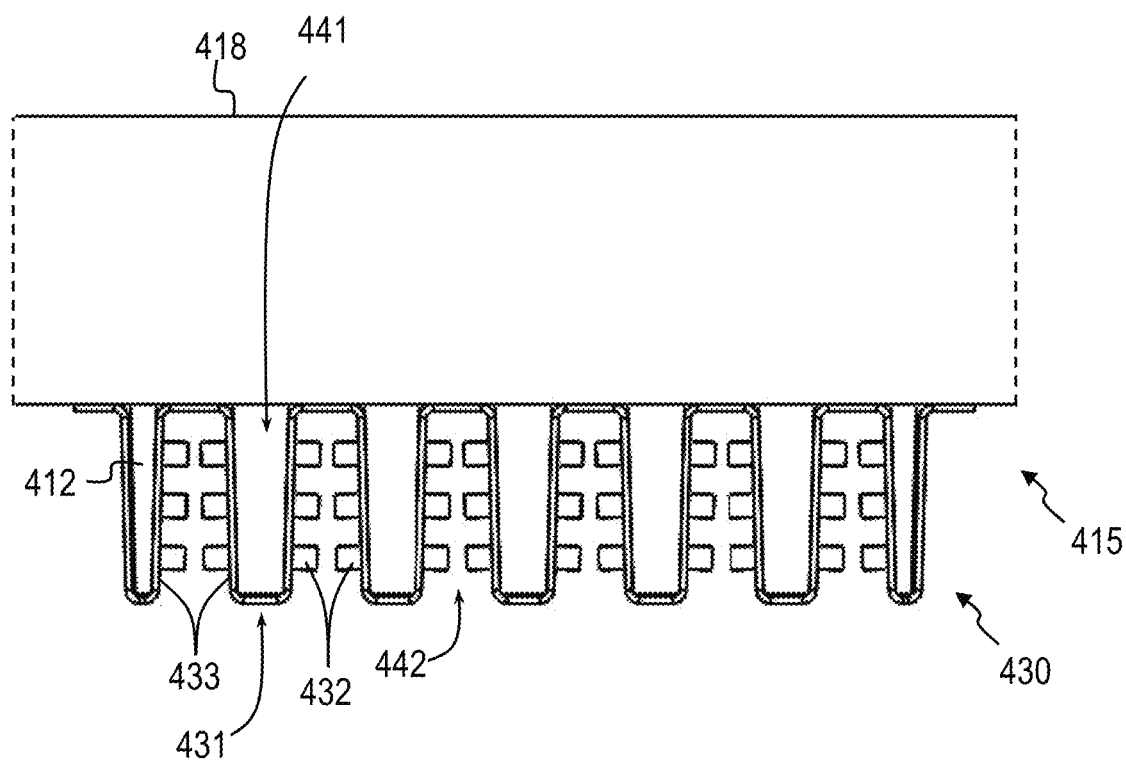
FIG. 16 is a front view of the portion of the cold plate and the corrugated thermal interface device in an assembled state.

As shown in FIGS. 15 and 16, a cold plate 415 comprises a base portion 418 and one or more sets of fins 412 coupled to the base portion 418. The fins 412 may be integral with the base portion 418 of the cold plate 415. For example, the fins 412 and a portion of the base portion 418 that is integral therewith may be formed together from a same piece of material by extrusion or other machining (e.g., skiving), or the fins 412 and a portion of the base portion 418 that is integral therewith may be integrally formed together by casting, molding, or additive manufacturing. Alternatively, the fins 412 and base portion 418 may be formed separately from one another and then joined together, for example by welding, solder, mechanical fasteners, etc. Moreover, the set of fins 412 is configured to engage with a corrugated thermal interface device 430, with the corrugated thermal interface device 430 being affixed to the cold plate 415 in the engaged state of the fins 412 therewith. FIG. 15 illustrates the cold plate 415 and the corrugated thermal interface device 430 in an unassembled state and FIG. 16 illustrates the cold plate 415 and the corrugated thermal interface device 430 in an assembled state with the corrugated thermal interface device 430 being engaged with the fins 412 and affixed to the cold plate 415.

While FIGS. 15 and 16 illustrate one set of fins 412 for simplicity, the cold plate 415 could have one or more sets of fins 412 with each set of fins 412 being similar to those depicted in FIGS. 15 and 16. More specifically, in such examples, each set of fins 412 is configured to interleave with a complementary set of fins (e.g., the fins 422, described in greater detail) of a corresponding electronic device that the cold plate 415 is to cool. In some examples, the cold plate 415 has just one set of fins 412 to engage with a complementary set of fins of one electronic device, whereas in other examples the cold plate 415 is provided with multiple sets of fins 412 to engage with fins of multiple electronic devices, respectively (for example, see the cold plate 415 shown in FIGS. 19 and 20, described in greater detail below). In configurations in which the cold plate 415 has multiple sets of fins 412, multiple corrugated thermal interface devices 430 may be provided to engage with the fins 412, respectively (e.g., one corrugated thermal interface device 430 per set of fins 412) or a single corrugated thermal interface device 430 may be provided which engages with all of the sets of fins 412.

As shown in FIG. 15, the corrugated thermal interface device 430 comprises a plurality of folded fins 431, which define a first set of grooves 441 on a first side and a second set of grooves 442 on a second side of the corrugated thermal interface device 430. As shown in FIGS. 15 and 16, when the fins 412 are engaged with the corrugated thermal interface device 430, each fin 412 is received within a corresponding groove 441 of a first set of grooves 441 with at least a portion of the fin 412 being in contact with a portion of the corrugated thermal interface device 430 (e.g., lateral surfaces of the fins 412 may be in contact with lateral walls 433 of the folded fins 431). As shown in FIGS. 15 and 16, the corrugated thermal interface device 430 also comprises spring fingers 432 coupled to the lateral walls 433 of the folded fins 431 and extending at least partially into the second set of grooves 442. The second set of grooves 442 is configured to receive another set of fins of an electronic device (such as a pluggable auxiliary device), as will be described in greater detail below.

Figure 17:
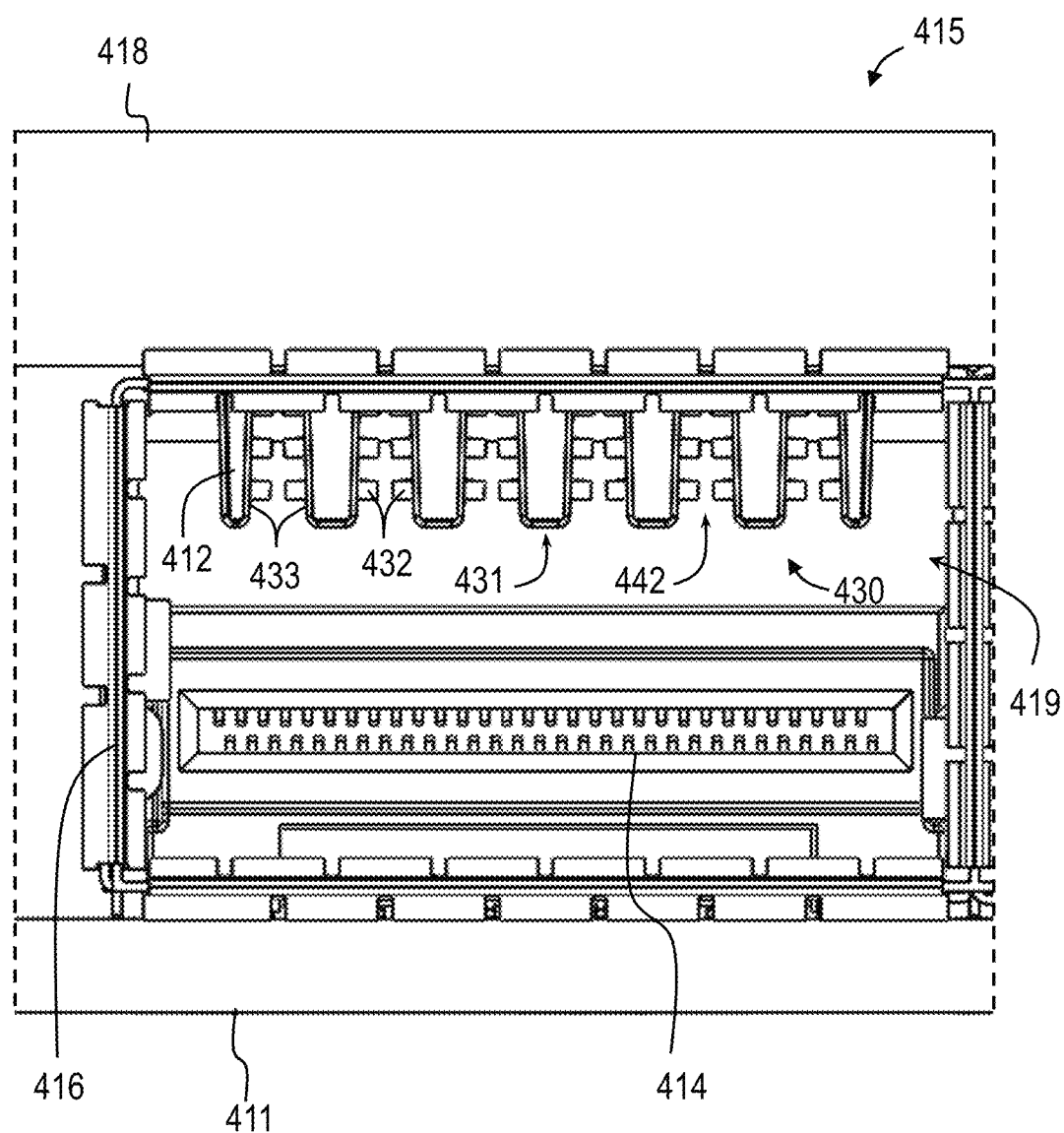
FIG. 17 is a front view of a portion of an example electronic device comprising the cold plate and the corrugated thermal interface device of FIG. 16 in the assembled state.

The cold plate 415 with one or more of the corrugated thermal interface devices 430 coupled thereto may be used as part of an electronic device 410, such as a computing device, networking device, or other electronic device configured to receive a pluggable electronic device. The electronic device 410 may be similar to the electronic device 110. As shown in FIGS. 19 and 20, the electronic device 410 comprises electronic circuitry 413, one or more cold plates 415, one or more corrugated thermal interface devices 430 attached to the cold plate(s) 415, and a chassis 411 supporting and/or housing the one or more cold plates 415 and the electronic circuitry 413. Moreover, the chassis 411 comprises one or more receptacles 416, each of which defines and partially encloses a volume 419, as shown in FIGS. 17 and 19. Each receptacle 416 is configured to receive a pluggable auxiliary device, such as the pluggable auxiliary device 420, removably plugged therein, as shown in FIGS. 17-20. FIGS. 17 and 19 illustrate an unplugged state of a single pluggable auxiliary device 420 with a corresponding receptacle 416 (i.e., state in which the pluggable auxiliary device 420 is removed from the receptacle 416), while FIGS. 18 and 20 illustrate a plugged-in state of the pluggable auxiliary device 420 received in the corresponding receptacle 416. Each cold plate 415 is positioned relative to one or more receptacles 416 such that the fins 412 of the cold plate 415 and the one or more corrugated thermal interface devices 430 affixed thereto extend into the volume(s) 419 defined by the receptacle(s) 416. In some arrangements, only one receptacle 416 and one cold plate 415 are provided. In other arrangements, the chassis 411 comprises multiple receptacles 416. In some cases in which the chassis 411 has multiple receptacles 416, a single cold plate 415 is provided which has multiple sets of fins 412, with each set of fins 412 extending into a corresponding one of the receptacles 416, as illustrated in FIGS. 19 and 20. In other cases in which the chassis 411 has multiple receptacles 416, multiple cold plates 415 are provided (e.g., one cold plate 415 per receptacle 416). While four receptacles 416 and four corresponding sets of fins 412 are illustrated in FIG. 19, any number of receptacles 416 and sets of fins 412 may be provided as those of ordinary skill in the art would appreciate. Moreover, other types of receptacles may also be present in the electronic device 410 in addition to the receptacles 416.

As shown in FIGS. 18 and 19, the pluggable auxiliary device 420 comprises a chassis 421, electronic circuitry (not illustrated) supported by and/or housed within the chassis 421, and a set of fins 422 thermally coupled to the electronic circuitry. The pluggable auxiliary device 420 may be used as the second electronic device 120. In FIG. 19 the pluggable auxiliary device 420 is illustrated as a pluggable optical transceiver (e.g., a QSFP+ connector, an OSFP connector, etc.) which is coupled to one end of an optical communication cable. In other examples, the pluggable auxiliary device 420 may be any other type of pluggable auxiliary device. As shown in FIG. 18, the fins 422 are configured to interleave with a corresponding set of fins 412 when the pluggable auxiliary device 420 is plugged into the receptacle 416, with the fins 422 being received within the second set of grooves 442 defined by the corrugated thermal interface device 430 coupled to the fins 412. As the fins 422 are being inserted into the second set of grooves 442, the fins 422 come into contact with and displace the spring fingers 432 such that they elastically deform and a restoring force presses the spring fingers 432 against the fins 422. Thus, a conductive thermal pathway is established between the electronic circuitry of the pluggable auxiliary device 420 and the cold plate 415, with the pathway extending from the fins 422 into the spring fingers 432, then into the lateral walls 433, then into the fins 412, and then into the base portion 418 of the cold plate 415.

As shown in FIGS. 19 and 20, the base portion 418 of the cold plate 415 comprises one or more coolant passages 417 through which liquid coolant can be flowed to remove heat from the cold plate 415. In some examples, the coolant passages 417 are bounded by interior surfaces of the base portion 418 such that the liquid coolant flowing through the coolant passages 417 is exposed to and impinges upon the interior surfaces of the base portion 418, thus allowing for heat transfer between the base portion 418 and the liquid coolant. These coolant passages 417 may be coupled at one end to a coolant supply line (not shown) of a liquid cooling loop and at the other end to a coolant return line (not shown) of the liquid cooling loop. A pump (not shown) may be fluidically coupled to the liquid supply and return lines to cause the liquid to flow through the coolant passages 417.

In other configurations (not illustrated), instead of exposing interior surfaces of the base portion 418 to the liquid coolant, the cold plate 415 may be configured to expose an exterior surface of the base portion 418 to the liquid coolant to transfer heat thereto. For example, a cover (not illustrated) may be coupled to the base portion 418 and define a chamber therebetween through which the liquid coolant may flow, with a top surface of the base portion 418 being exposed to the liquid coolant in the chamber. In still other examples (not illustrated), instead of directly exposing surfaces of the base portion 418 to the liquid coolant, the cold plate 415 may be configured to indirectly transfer heat from the cold plate 415 into the liquid coolant. For example, a thermal transfer device, such as a heat pipe, vapor chamber, metal bar, etc., may be thermally coupled to the cold plate 415 and thermally coupled to another device through which the liquid coolant flows.

In the description above, various types of electronic circuitry are described, including the electronic circuitry 113, 123, 213, 413 and electronic circuitry of the pluggable auxiliary devices 320 and 420. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry. In some cases, certain electronic circuitry may comprise processing circuitry. Processing circuitry comprises circuitry configured with logic for performing the various operations. The logic of the processing circuitry may comprise dedicated hardware to perform various operations, software (machine readable and/or processor executable instructions) to perform various operations, or any combination thereof. In examples in which the logic comprises software, the processing circuitry may include a processor to execute the software instructions and a memory device that stores the software. The processor may comprise one or more processing devices capable of executing machine readable instructions, such as, for example, a processor, a processor core, a central processing unit (CPU), a controller, a microcontroller, a system-on-chip (SoC), a digital signal processor (DSP), a graphics processing unit (GPU), etc. In cases in which the processing circuitry includes dedicated hardware, in addition to or in lieu of the processor, the dedicated hardware may include any electronic device that is configured to perform specific operations, such as an Application Specific Integrated Circuit (ASIC), a Field Programmable Gate Array (FPGA), a Complex Programmable Logic Device (CPLD), discrete logic circuits, a hardware accelerator, a hardware encoder, etc. The processing circuitry may also include any combination of dedicated hardware and processor plus software.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

Further, spatial, positional, and relational terminology used herein is chosen to aid the reader in understanding examples of the invention but is not intended to limit the invention to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Thus, for example, the direction "up" in the figures does not necessarily correspond to an "up" in a world reference frame (e.g., away from the Earth's surface). Furthermore, if a different reference frame is considered than the one illustrated in the figures, then the spatial terms used herein may need to be interpreted differently in that different reference frame. For example, the direction referred to as "up" in relation to one of the figures may correspond to a direction that is called "down" in relation to a different reference frame that is rotated 180 degrees from the figure's reference frame. As another example, if a device is turned over 180 degrees in a world reference frame as compared to how it was illustrated in the figures, then an item described herein as being "above" or "over" a second item in relation to the Figures would be "below" or "beneath" the second item in relation to the world reference frame. Moreover, the poses of items illustrated in the figure are chosen for convenience of illustration and description, but in an implementation in practice the items may be posed differently.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

Elastically Deformable: As used herein, a spring finger is elastically deformable (capable of being elastically deformed) if its deformation is elastic throughout its working range of motion, with the working range of motion extending from a resting or nominal position of the spring finger to a position of the spring finger when displaced by a fin inserted into the groove into which the spring finger protrudes or a position in which a free end of the spring finger is 1 mm from its resting position. The deformation of the spring finger is elastic if the deformation resulting from the displacement is not permanent and the spring finger substantially returns to its original configuration when the force that caused the displacement is removed.

Cold Plate: As used herein, "cold plate" refers to a device that receives heat from a solid body via conduction (contact) and dissipates that heat into liquid coolant of a liquid cooling loop. The liquid coolant may be in direct contact with the cold plate (e.g., flowing through an interior chamber of the cold plate) or may be flowing through another device that is thermally coupled with the cold plate.

Thermally Coupled: As used herein, to "thermally couple" two objects means to provide a thermally conductive pathway between the objects that allows heat to be conducted between the objects. Two objects may be considered to be thermally coupled if any of the following are true: (1) the two objects are in contact with one another (either direct contact, or contact via a TIM), (2) the objects are both thermally coupled to a thermally conductive intermediary (e.g., a heat pipe, heat spreader, etc.) (or to a chain of thermally conductive intermediaries thermally coupled together), or (3) a heat transfer coefficient between the two objects is 10 $W \cdot m^{-2} \cdot K^{-1}$ or greater.

Thermally conductive: An object, device, or assembly (which may comprise multiple distinct bodies that are thermally coupled, and may include multiple different materials), is "thermally conductive" between two thermal interfaces if any one of the following is true: (1) a heat transfer coefficient between the thermal interfaces is 10 $W \cdot m^{-2} \cdot K^{-1}$ or greater at any temperature between 0° C. and 100° C., (2) the object is a continuous piece of a material that has a thermal conductivity (often denoted k, λ, or κ) between the two interfaces of 1 $W \cdot m^{-2} \cdot K^{-1}$ or greater at any temperature between 0° C. and 100° C., (3) the object is a heat pipe, vapor chamber, continuous body of copper, or continuous body of aluminum. Examples of materials whose thermal conductivity is greater than 1 $W \cdot m^{-2} \cdot K^{-1}$ between 0° C. and 100° C. include almost all metals and their alloys (e.g., copper, aluminum, gold, etc.), some plastics (e.g., TECA-COMP® TC compounds, CoolPoly® D-series Thermally Conductive Plastics), and many other materials.

Highly thermally conductive: An object, device, or assembly (which may comprise multiple distinct bodies that are thermally coupled, and may include multiple different materials), is "highly thermally conductive" between two thermal interfaces if any one of the following is true: (1) a heat transfer coefficient between the thermal interfaces is 1000 $W \cdot m^{-2} \cdot K^{-1}$ or greater at any temperature between 0° C. and 100° C., (2) the object is a continuous piece of a material that has a thermal conductivity (often denoted k, λ, or κ) between the two interfaces of 100 $W \cdot m^{-2} \cdot K^{-1}$ or greater at any temperature between 0° C. and 100° C., (3) the object is a heat pipe, vapor chamber, continuous body of copper, or continuous body of aluminum. Examples of materials whose thermal conductivity is 100 $W \cdot m^{-2} \cdot K^{-1}$ or greater between 0° C. and 100° C. include certain types of copper, aluminum, silver, and gold.

Longitudinal: As used herein, longitudinal refers to a direction that is parallel to the folded fins, i.e., parallel to a direction of greatest extent of an individual folded fin (and also parallel to the grooves defined by the folded fins). Thus, references herein to a longitudinal dimension of the folded fins should be understood as referring to a dimension of the corrugated thermal interface device that is parallel to the direction of extent of each individual folded fin thereof, which can be but does not necessarily have to be the longest dimension of the overall corrugated thermal interface device.

Lateral: As used herein, lateral refers to a direction that is perpendicular to longitudinal and height dimensions of the folded fins, wherein the height dimension is a dimension of second greatest extent of the folded fins.

Provide: As used herein, to "provide" an item means to have possession of and/or control over the item. This may include, for example, forming (or assembling) some or all of the item from its constituent materials and/or, obtaining possession of and/or control over an already-formed item.

When items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," "generally," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An electronic device comprising:
   a chassis configured to removably couple with a second electronic device;
   a plurality of first fins configured to interleave with a plurality of second fins of the second electronic device in a coupled state of the electronic device with the second electronic device; and
   a corrugated thermal interface device comprising:
      a plurality of folded fins engaged with the plurality of first fins, each folded fin of the plurality of folded fins comprising one or more lateral walls; and
      a plurality of spring fingers coupled to and extending at least partially in a lateral direction from the lateral walls of the folded fins,
   wherein the plurality of spring fingers are configured to contact lateral surfaces of the plurality of second fins in a coupled state of the electronic device with the second electronic device.

2. The electronic device of claim 1, wherein:
   the plurality of folded fins define a first set of grooves on a first side of the corrugated thermal interface device, the plurality of first fins being located within the first set of grooves;
   the plurality of folded fins define a second set of grooves on a second side of the corrugated thermal interface device opposite the first side, the second set of grooves configured to removably receive the plurality of second fins in a coupled state of the electronic device with the second electronic device; and
   the plurality of spring fingers extend into the second set of grooves.

3. The electronic device of claim 1, wherein:
   each folded fin of the plurality of folded fins, excluding outermost folded fins, comprises a pair of the lateral walls and a first end wall coupling the pair of lateral walls together; and
   each folded fin of the plurality of folded fins is coupled to an adjacent folded fin of the plurality of folded fins by a second end wall.

4. The electronic device of claim 3, wherein:
   the plurality of folded fins are integrally coupled together.

5. The electronic device of claim 1, wherein:
   the plurality of spring fingers are integrally coupled with the lateral walls of the plurality of folded fins.

6. The electronic device of claim 5, wherein:
   each spring finger of the plurality of spring fingers comprises an attached end integrally coupled to one of the lateral walls and a free end that is spaced laterally apart from the lateral wall to which the respective spring finger is coupled.

7. The electronic device of claim 6, wherein:
   each spring finger of the plurality of spring fingers comprises a first bend at the attached end bending laterally away from the lateral wall to which the respective spring finger is coupled and a second bend near the free end bending laterally back towards the lateral wall to which the respective spring finger is coupled.

8. The electronic device of claim 1, wherein:
the plurality of folded fins and the plurality of spring fingers of the corrugated thermal interface device are parts of a single unitary body.

9. The electronic device of claim 1, wherein:
the corrugated thermal interface device comprises a highly thermally conductive metal.

10. The electronic device of claim 1, wherein:
the plurality of first fins comprises extruded fins.

11. The electronic device of claim 1, wherein:
the second electronic device is a pluggable auxiliary device;
the electronic device further comprises a cold plate thermally coupled to the plurality of first fins; and
the chassis comprises a receptacle configured to removably receive the second electronic device in a coupled state of the electronic device with the second electronic device, the plurality of first fins extending into the receptacle.

12. The electronic device of claim 1, wherein:
the electronic device is a pluggable auxiliary device and is configured to be removably received within a receptacle of the second electronic device in a coupled state of the electronic device with the second electronic device, and
the electronic device further comprises electronic circuitry thermally coupled with the plurality of first fins.

13. A system comprising:
a first electronic device comprising a plurality of first fins;
a second electronic device removably couplable with the first electronic device and comprising a plurality of second fins configured to interleave with the plurality of first fins in a coupled state of the first and second electronic devices; and
a corrugated thermal interface device comprising:
    a plurality of folded fins attached to the plurality of first fins, each folded fin of the plurality of folded fins comprising one or more lateral walls; and
    a plurality of spring fingers coupled to and extending at least partially in a lateral direction from the lateral walls of the folded fins; and
    wherein the plurality of second fins contact and displace the plurality of spring fingers as the plurality of second fins are interleaved with the plurality of first fins.

14. The system of claim 13, wherein:
the first electronic device is a pluggable auxiliary device and is configured to be removably received within a receptacle of the second electronic device in a coupled state of the first and second electronic devices, and
the first electronic device further comprises electronic circuitry thermally coupled with the plurality of first fins; and
the second electronic device further comprises a liquid cooling loop comprising a cold plate thermally coupled with the plurality of second fins.

15. The system of claim 13, wherein:
the second electronic device is a pluggable auxiliary device and is configured to be removably received within a receptacle of the first electronic device in a coupled state of the first and second electronic devices, and
the second electronic device further comprises electronic circuitry thermally coupled with the plurality of second fins; and
the first electronic device further comprises a liquid cooling loop comprising a cold plate thermally coupled with the plurality of second fins.

16. The system of claim 13, wherein, in a coupled state of the first and second electronic devices, the corrugated thermal interface device forms a heat transfer path between the plurality of first fins and the plurality of second fins capable of transferring heat between the plurality of first fins and the plurality of second fins at a rate of at least 0.005 Watts per degree Celsius of temperature differential between the plurality of first fins and the plurality of second fins and per spring finger contact.

17. A method comprising:
inserting a first electronic device into a receptacle of a second electronic device; and
thermally coupling the first electronic device to the second electronic device via a corrugated thermal interface device disposed between the first and second electronic devices, wherein the thermally coupling the first electronic device to the second electronic device comprises, while inserting the first electronic device into the receptacle:
    interleaving a plurality of first fins of the first electronic device with a plurality of second fins of the second electronic device such that a plurality of folded fins of the corrugated thermal interface device are engaged with the plurality of first fins and the plurality of second fins; and
    causing a plurality of spring fingers coupled to the folded fins of the corrugated thermal interface device to contact lateral surfaces of one of the plurality of first fins or the plurality of second fins.

18. The method of claim 17, wherein:
prior to inserting the first electronic device into the receptacle, the corrugated thermal interface device is affixed to the other one of the plurality of first fins or the plurality of second fins.

19. The method of claim 17, wherein:
thermally coupling the plurality of second fins to liquid coolant of a liquid cooling loop.

* * * * *